US010204692B1

(12) United States Patent
Kamata et al.

(10) Patent No.: US 10,204,692 B1
(45) Date of Patent: Feb. 12, 2019

(54) SEMICONDUCTOR MEMORY DEVICE

(71) Applicant: Toshiba Memory Corporation, Minato-ku (JP)

(72) Inventors: Yoshihiko Kamata, Yokohama (JP); Naofumi Abiko, Kawasaki (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/886,464

(22) Filed: Feb. 1, 2018

(30) Foreign Application Priority Data

Sep. 14, 2017 (JP) .................................. 2017-176641

(51) Int. Cl.
G11C 16/10 (2006.01)
G11C 16/34 (2006.01)
G11C 11/4094 (2006.01)
G11C 7/12 (2006.01)
G11C 16/04 (2006.01)
G11C 11/56 (2006.01)

(52) U.S. Cl.
CPC ............ *G11C 16/3445* (2013.01); *G11C 7/12* (2013.01); *G11C 11/4094* (2013.01); *G11C 11/5635* (2013.01); *G11C 16/0475* (2013.01); *G11C 16/0483* (2013.01); *G11C 16/3459* (2013.01); *G11C 2211/5641* (2013.01)

(58) Field of Classification Search
CPC ......... G11C 16/10; G11C 16/30; G11C 16/12; G11C 16/0483
USPC .................................................... 365/185.18
See application file for complete search history.

(56) References Cited

U.S. PATENT DOCUMENTS

| 6,519,198 | B2 | 2/2003 | Suematsu et al. |
| 8,908,457 | B2 | 12/2014 | Furutani et al. |
| 2009/0267128 | A1 | 10/2009 | Maejima |
| 2009/0268522 | A1 | 10/2009 | Maejima |
| 2010/0207195 | A1 | 8/2010 | Fukuzumi et al. |
| 2010/0214838 | A1 | 8/2010 | Hishida et al. |
| 2011/0284946 | A1 | 11/2011 | Kiyotoshi |
| 2012/0008380 | A1 | 1/2012 | El Baraji et al. |
| 2012/0069663 | A1 | 3/2012 | Itagaki et al. |
| 2016/0180934 | A1* | 6/2016 | Sakui ................. G11C 16/0483 365/185.11 |

FOREIGN PATENT DOCUMENTS

| JP | 2002-74960 | 3/2002 |
| JP | 2012-230737 | 11/2012 |

* cited by examiner

Primary Examiner — Son Dinh
(74) Attorney, Agent, or Firm — Oblon, McClelland, Maier & Neustadt, L.L.P.

(57) ABSTRACT

According to one embodiment, a semiconductor memory device includes first and second memory cells, a first word line, first and second sense amplifiers, first and second bit lines, a controller. The first and second sense amplifiers each include first and second transistors. The first bit line is connected between the first memory cell and the first transistor. The second bit line is connected between the second memory cell and the second transistor. In the read operation, the controller is configured to apply a kick voltage to the first word line before applying the read voltage to the first word line, and to apply a first voltage to a gate of the first transistor and a second voltage to a gate of the second transistor while applying the kick voltage to the first word line.

20 Claims, 29 Drawing Sheets

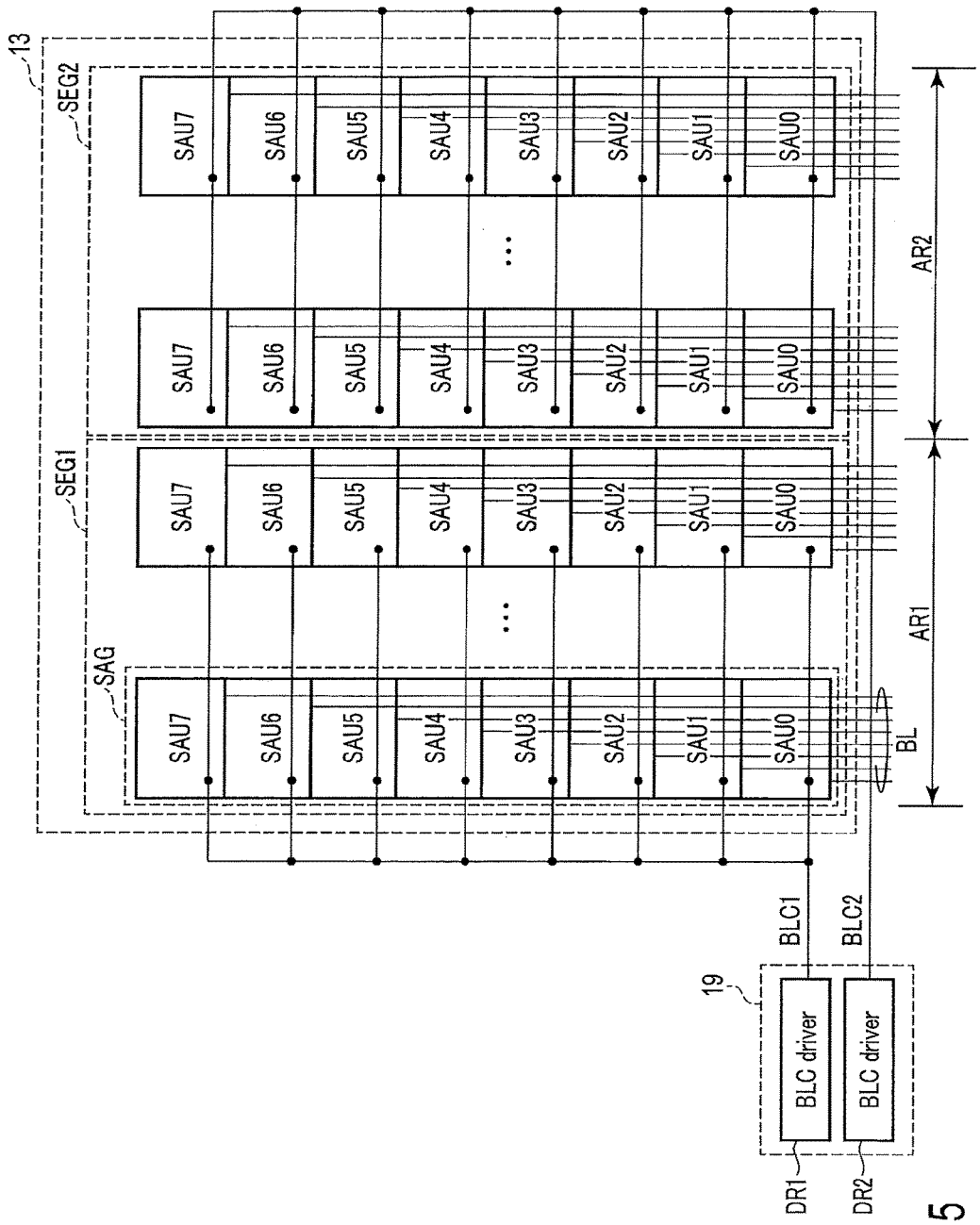
F I G. 5

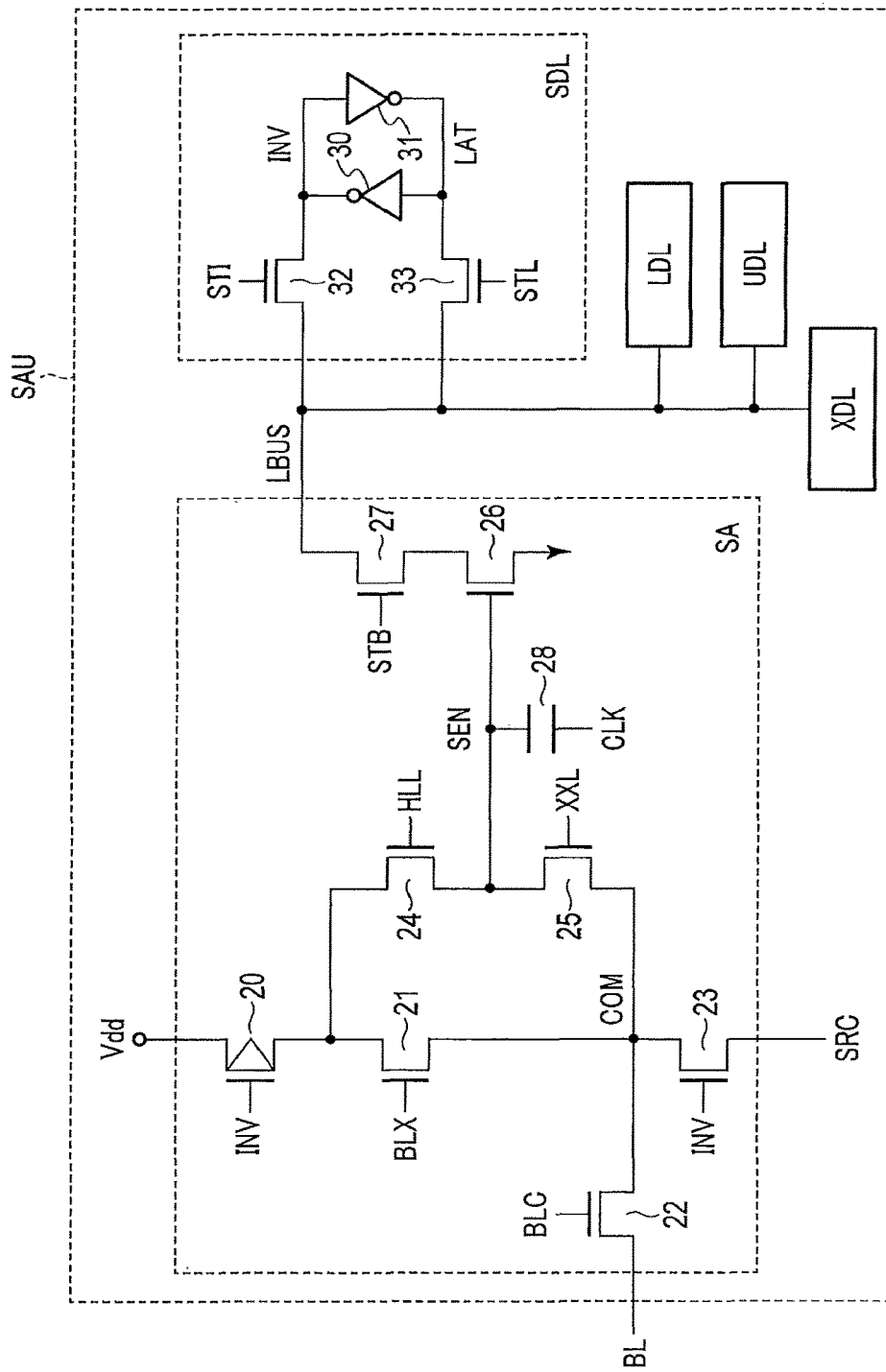
F I G. 6

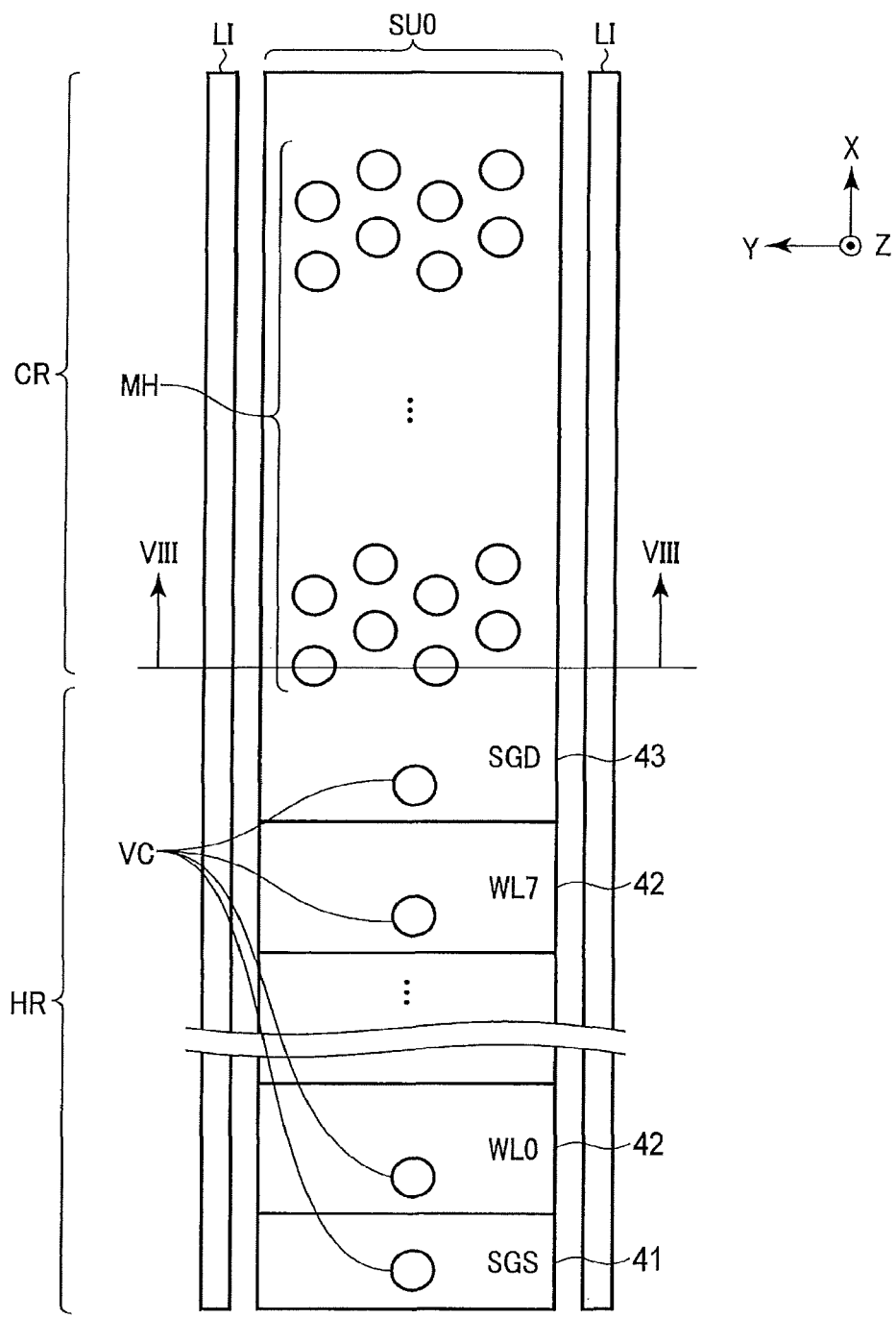
F I G. 7

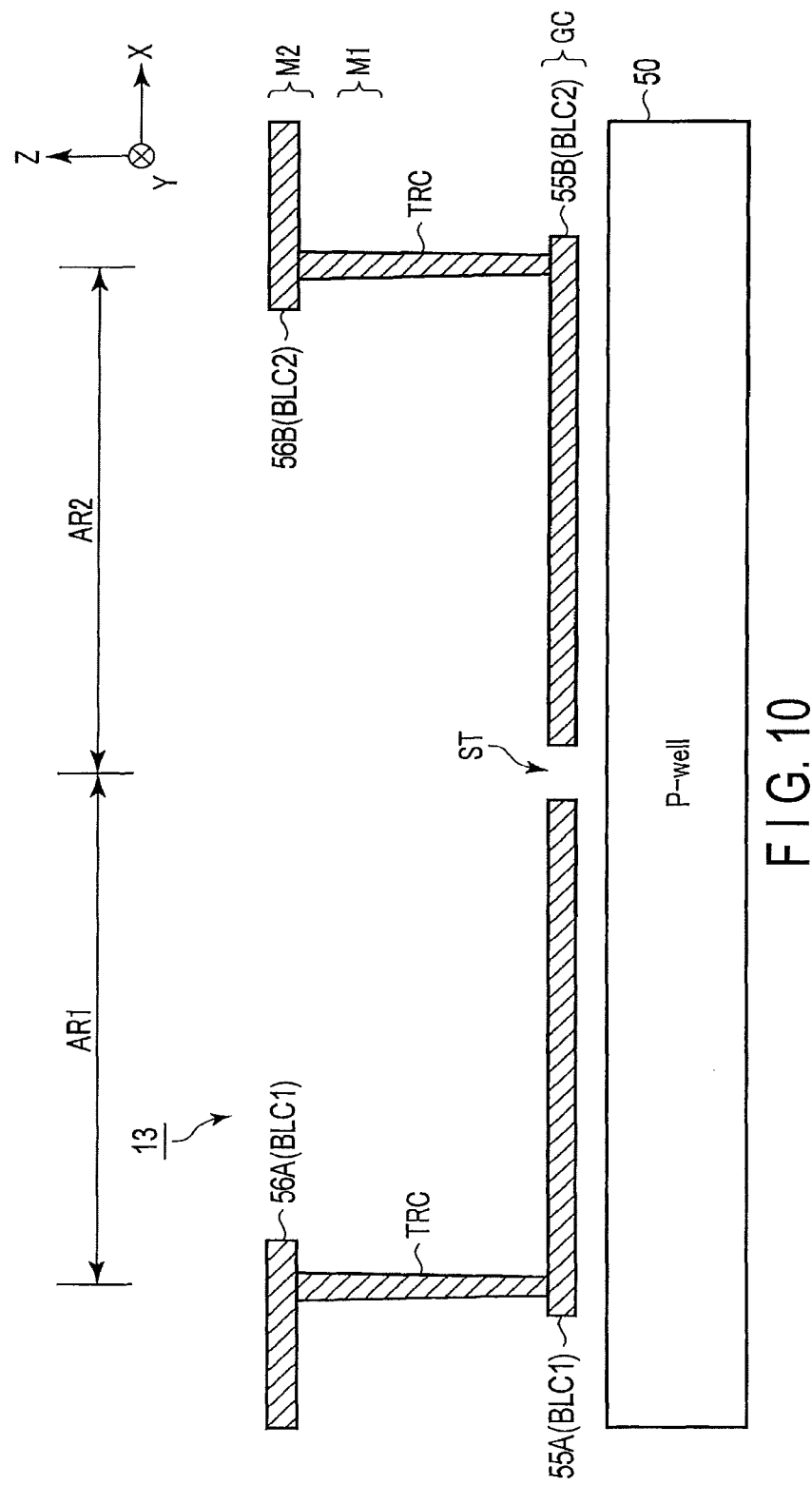
F I G. 10

| Selected block | Kick operation ||
|---|---|---|
| | BLC1 | BLC2 |
| Even | Performed | Not performed |
| Odd | Not performed | Performed |

F I G. 11

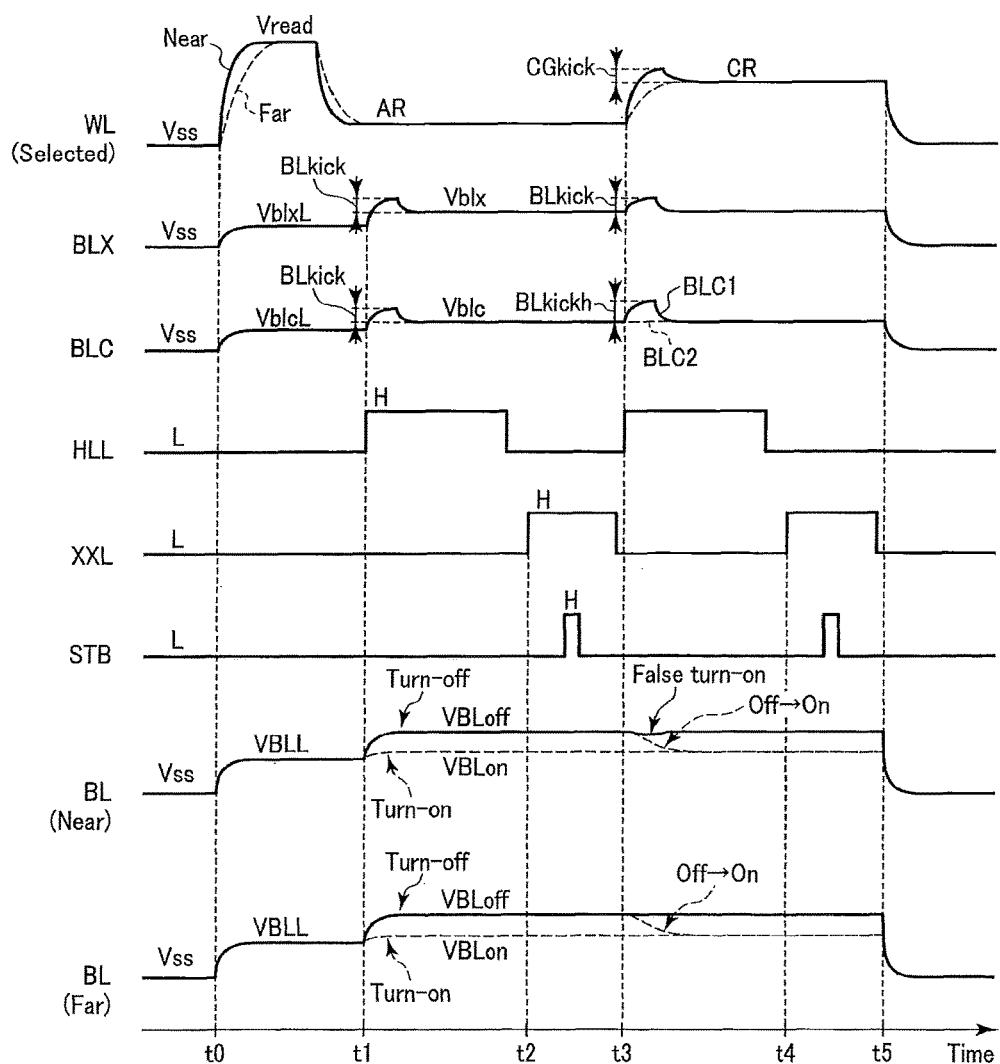
F I G. 12

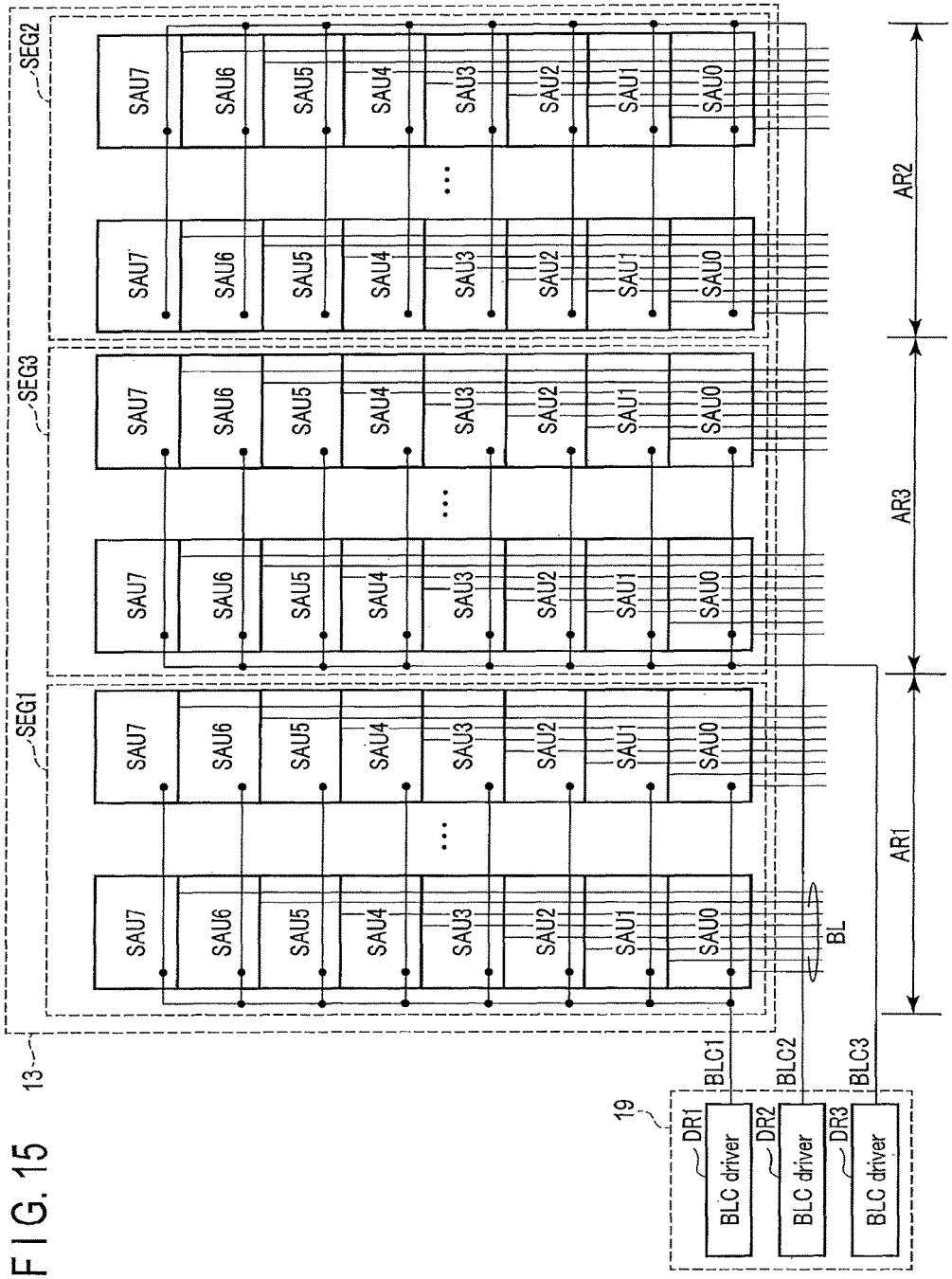
F I G. 15

| Selected block | Kick operation | | |
| --- | --- | --- | --- |
| | BLC1 | BLC2 | BLC3 |
| Even | Performed | Not performed | Not performed |
| Odd | Not performed | Performed | Not performed |

F I G. 17

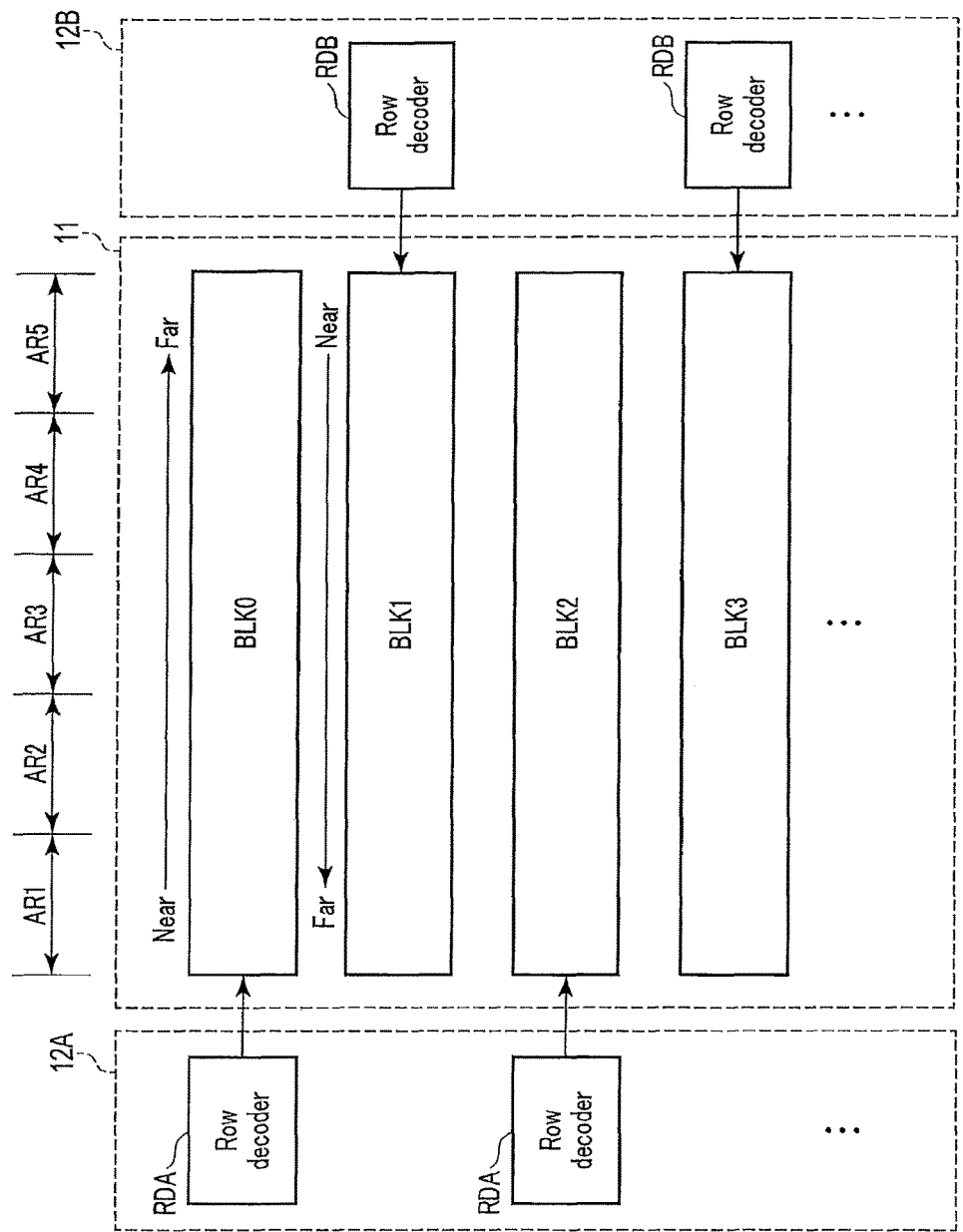
F I G. 18

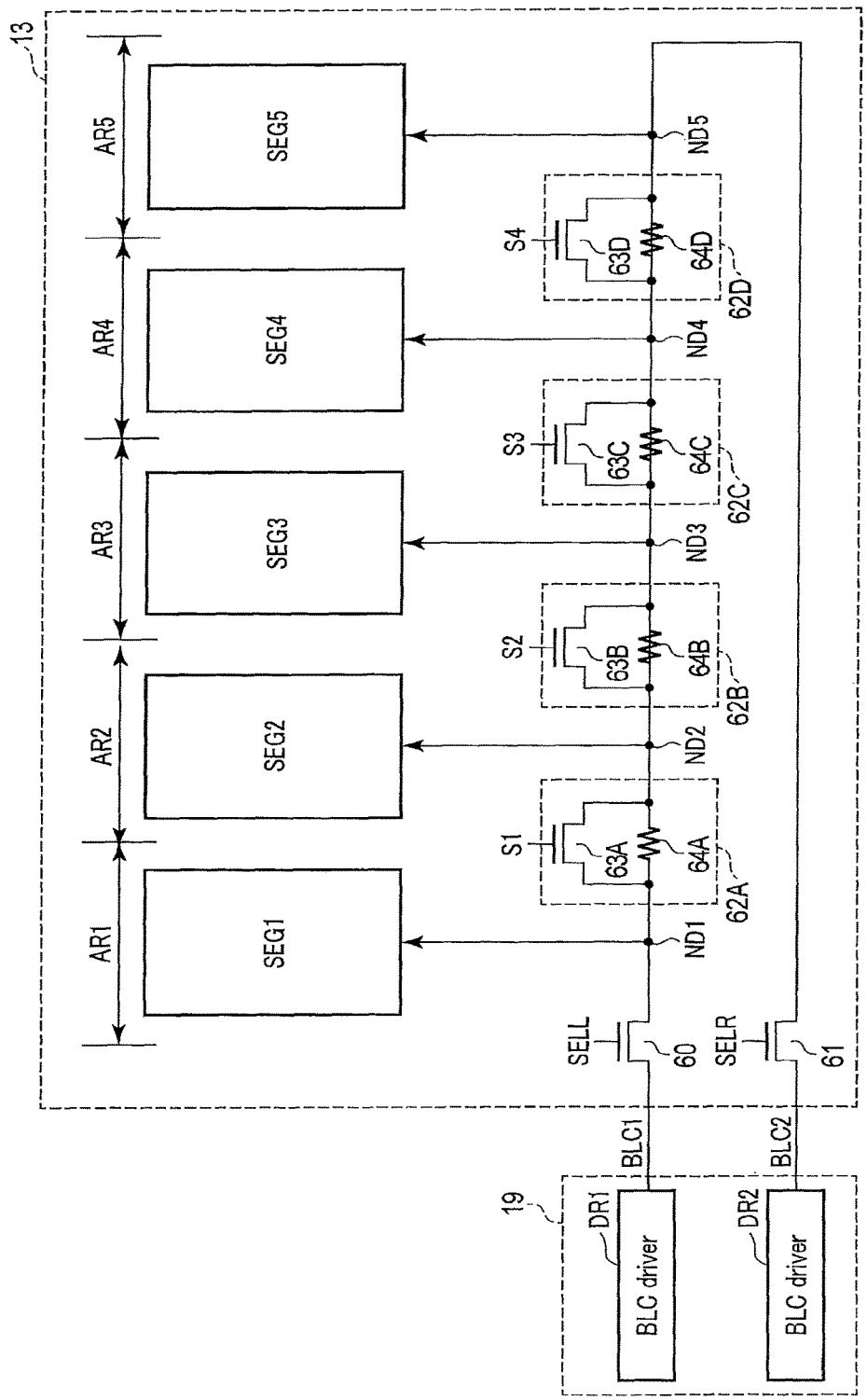
F I G. 19

| Selected block | Selected word line | Gate voltage | | | | | |
|---|---|---|---|---|---|---|---|
| | | SELL | SELR | S1 | S2 | S3 | S4 |
| Even | First group | "H" | "L" | "H" | "H" | "L" | "L" |
| Even | Second group | "H" | "L" | "H" | "L" | "L" | "L" |
| Odd | First group | "L" | "H" | "L" | "L" | "H" | "H" |
| Odd | Second group | "L" | "H" | "L" | "L" | "L" | "H" |

F I G. 20

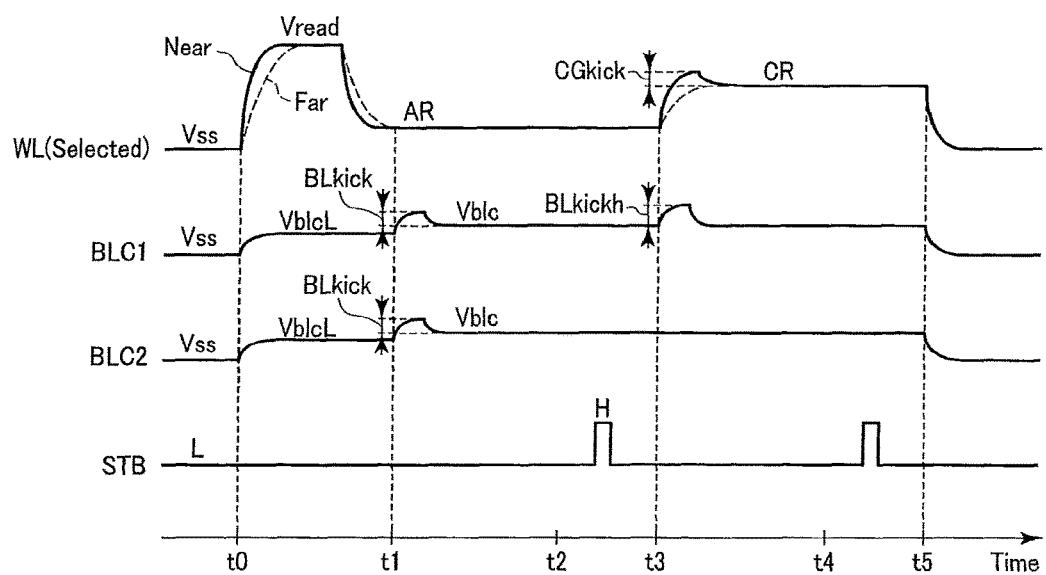
F I G. 24

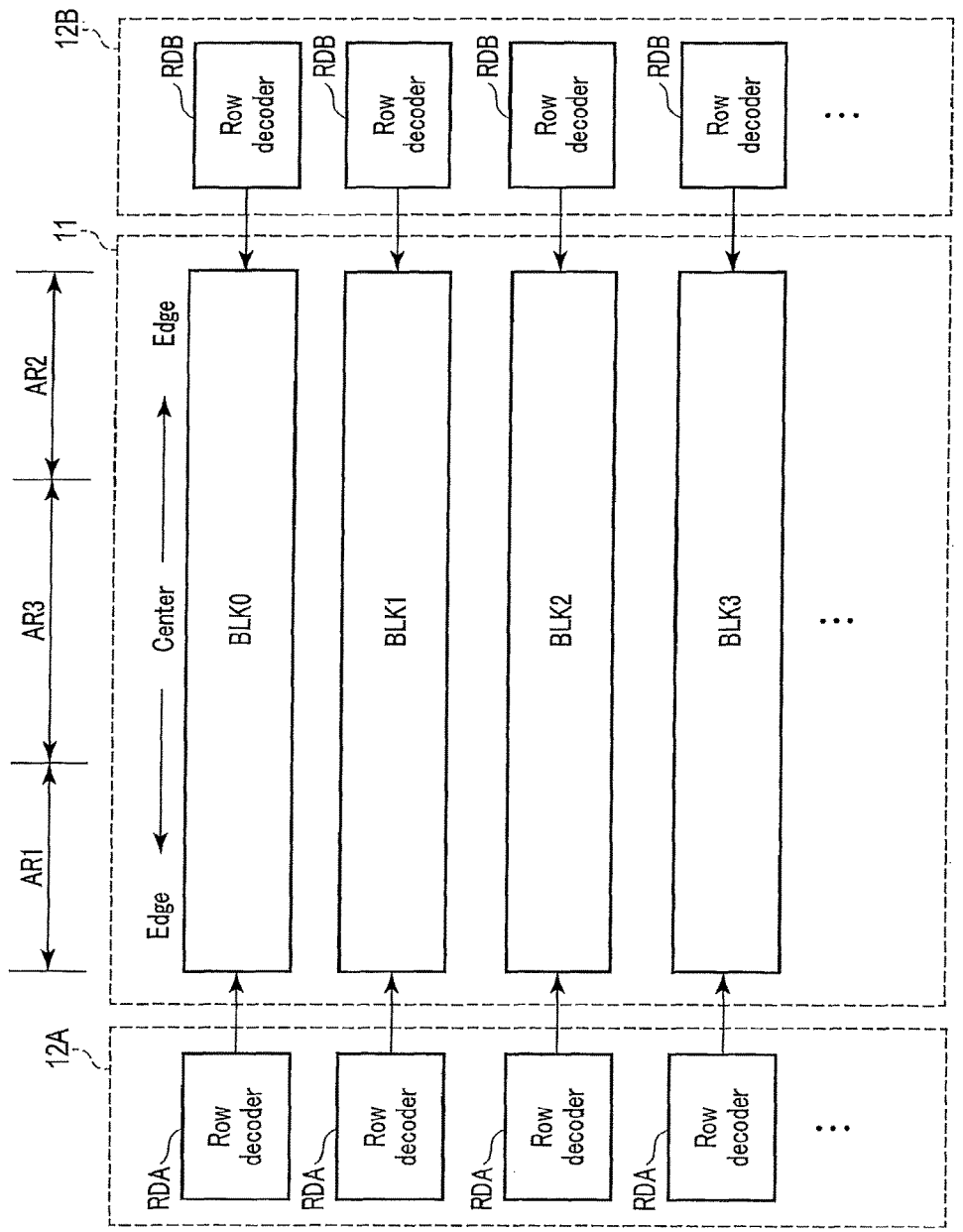
F I G. 25

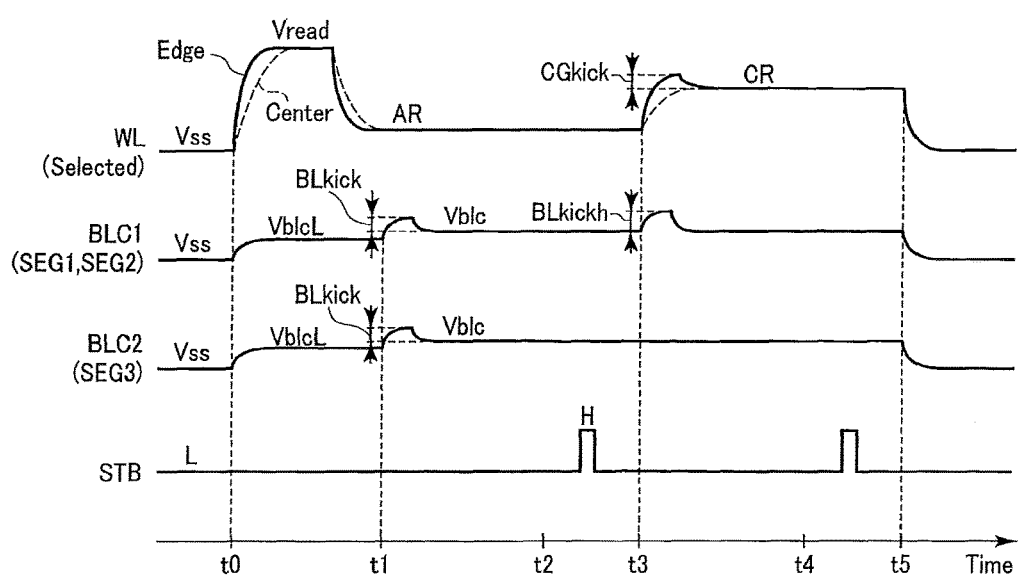
F I G. 27

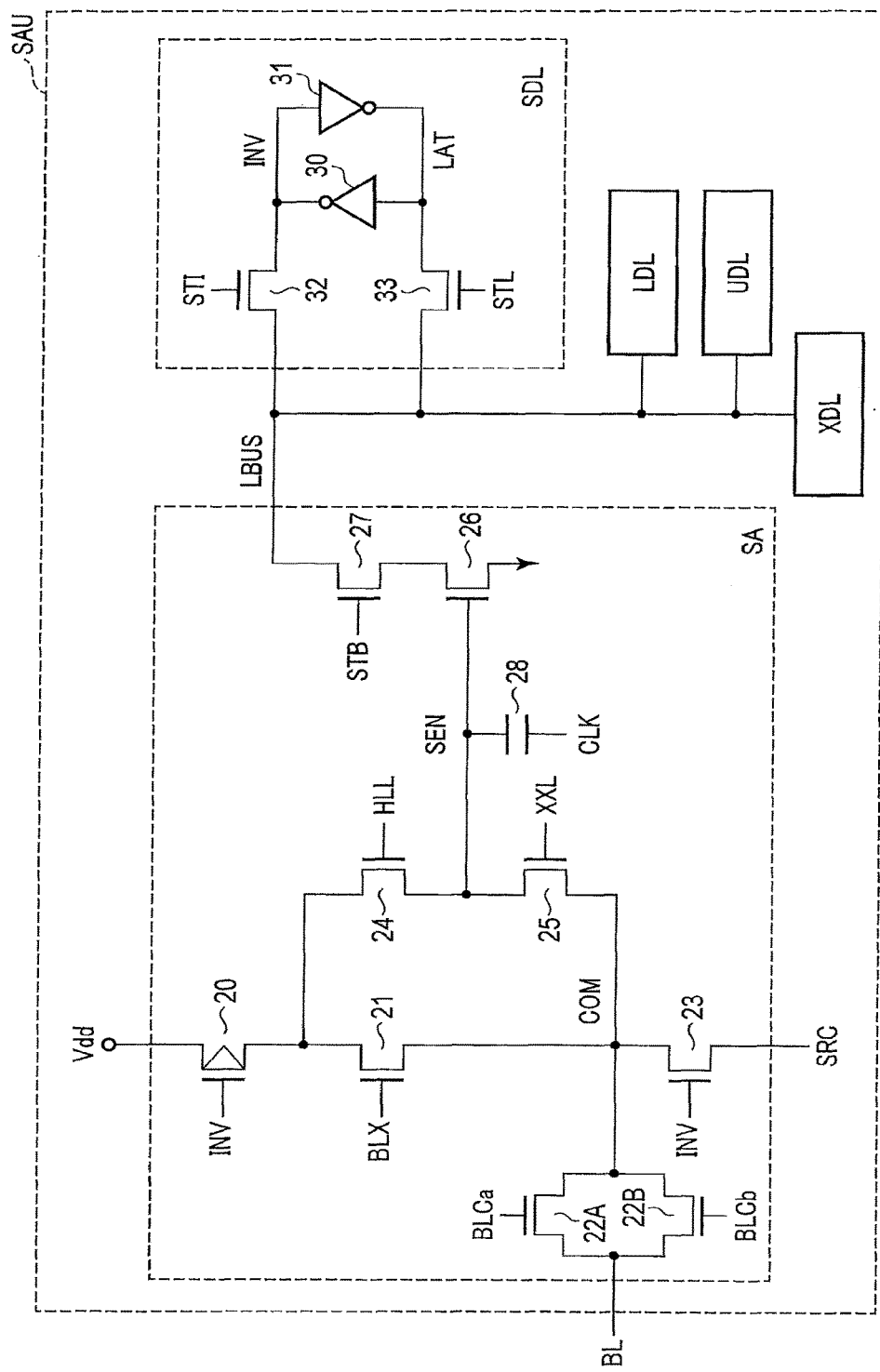
F I G. 28

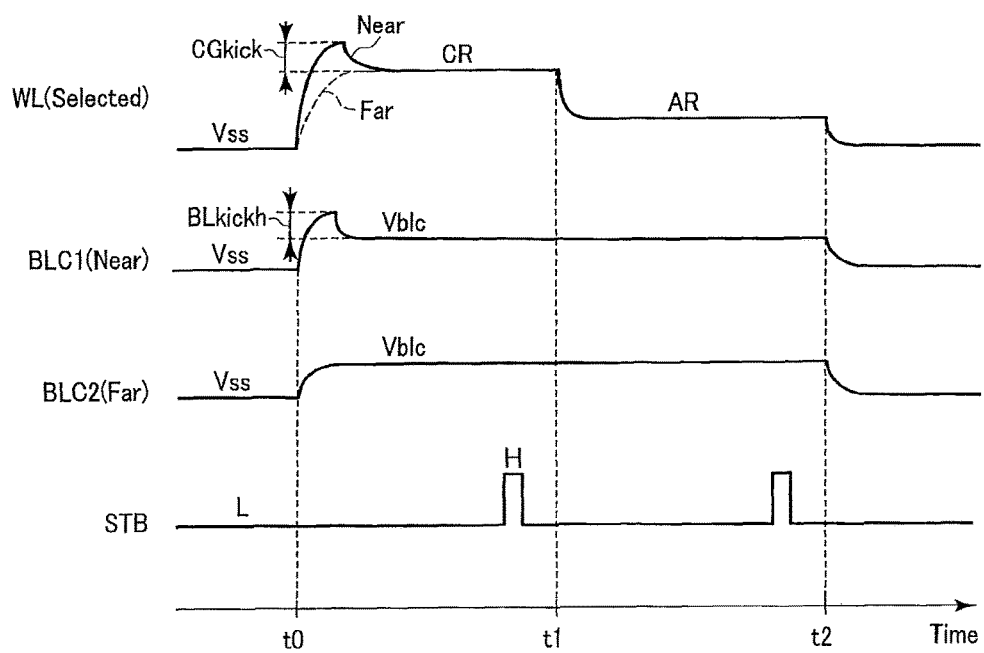
F I G. 29
F I G. 30

SEMICONDUCTOR MEMORY DEVICE

CROSS-REFERENCE TO RELATED APPLICATIONS

This application is based upon and claims the benefit of priority from Japanese Patent Application No. 2017-176641, filed Sep. 14, 2017, the entire contents of which are incorporated herein by reference.

FIELD

Embodiments described herein relate generally to a semiconductor memory device.

BACKGROUND

A NAND type flash memory as a semiconductor memory device is known.

BRIEF DESCRIPTION OF THE DRAWINGS

FIG. 5 is a block diagram illustrating a detailed configuration example of a sense amplifier module and a voltage generator included in the semiconductor memory device according to the first embodiment;

FIG. 6 is a block diagram illustrating a configuration example of the sense amplifier module included in the semiconductor memory device according to the first embodiment;

FIG. 7 is a diagram illustrating an example of a plane layout of the memory cell array included in the semiconductor memory device according to the first embodiment;

FIG. 10 is a diagram illustrating an example of a sectional structure of the sense amplifier module included in the semiconductor memory device according to the first embodiment;

FIG. 11 is a table showing an example of a read operation in the semiconductor memory device according to the first embodiment;

FIG. 12 is a diagram illustrating examples of waveforms in the read operation in the semiconductor memory device according to the first embodiment;

FIG. 15 is a circuit diagram illustrating a configuration example of the sense amplifier module included in the semiconductor memory device according to the second embodiment;

FIG. 17 is a table showing an example of a read operation in the semiconductor memory device according to the second embodiment;

FIG. 18 is a block diagram illustrating a detailed configuration example of a memory cell array and a row decoder module included in a semiconductor memory device according to a third embodiment;

FIG. 19 is a block diagram illustrating a detailed configuration example of a sense amplifier module and a voltage generator included in the semiconductor memory device according to the third embodiment;

FIG. 20 is a table showing an example of a read operation in the semiconductor memory device according to the third embodiment;

FIG. 24 is a diagram illustrating examples of waveforms in a read operation in the semiconductor memory device according to the fourth embodiment;

FIG. 25 is a block diagram illustrating a detailed configuration example of a memory cell array and a row decoder module included in a semiconductor memory device according to a fifth embodiment;

FIG. 27 is a diagram illustrating examples of waveforms in a read operation in the semiconductor memory device according to the fifth embodiment;

FIG. 28 is a block diagram illustrating a configuration example of the sense amplifier module included in the semiconductor memory device according to the sixth embodiment;

FIG. 29 is a table showing an example of a read operation in the semiconductor memory device according to the sixth embodiment; and FIG. 30 is a diagram illustrating examples of waveforms in a read operation in the semiconductor memory device according to a modification of the first embodiment.

DETAILED DESCRIPTION

A semiconductor memory device according to embodiments includes a first memory cell and a second memory cell, a first word line, a first sense amplifier and a second sense amplifier, a first bit line and a second bit line, and a controller. The first word line is connected to the first and second memory cells. The first and second sense amplifiers include a first transistor and a second transistor, respectively. The first bit line is connected between the first memory cell and the first transistor. The second bit line is connected between the second memory cell and the second transistor. The controller performs a read operation. The controller is configured to apply, in the read operation, a kick voltage higher than a read voltage to the first word line before applying the read voltage to the first word line, and applies a first voltage to a gate of the first transistor and a second voltage lower than the first voltage to a gate of the second transistor while applying the kick voltage to the first word line.

Hereinafter, embodiments will be described with reference to the drawings. The drawings are schematic. In the following description, the same reference signs denote constituent elements having substantially the same functions and configurations. Numeric characters after the letters constituting a reference sign, letters after the numeric characters constituting a reference sign, and "under bar+letters" attached to the letters constituting a reference sign are referenced by reference signs containing the same letters, and are used to distinguish components having a similar configuration. When the components denoted by the reference signs containing the same letters do not need to be distinguished from each other, the components are referred to by the reference signs containing only the same letters or numeric characters.

[1] First Embodiment

A semiconductor memory device according to a first embodiment will be described below.

[1-1] Configuration

[1-1-1] General Configuration of the Semiconductor Memory Device 10

Figure 1:
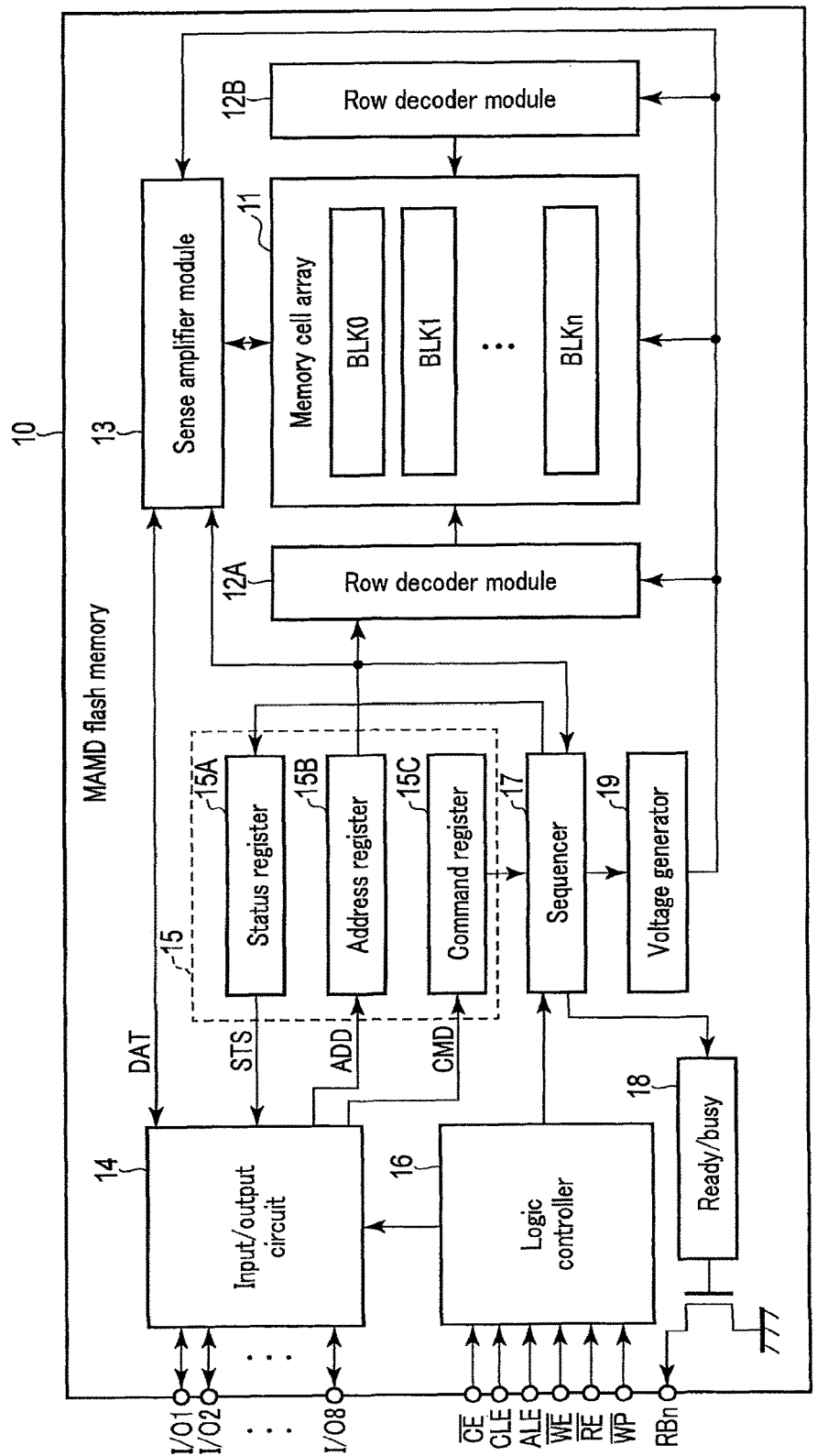
FIG. 1 is a block diagram illustrating an example of a general configuration of a semiconductor memory device according to a first embodiment.

FIG. 1 is a block diagram illustrating an example of a general configuration of a semiconductor memory device according to the first embodiment. As illustrated in FIG. 1, the semiconductor memory device 10 includes a memory cell array 11, row decoder modules 12A and 12B, a sense amplifier module 13, an input/output circuit 14, a register 15, a logic controller 16, a sequencer 17, a ready/busy controller 18, and a voltage generator 19.

The memory cell array 11 includes blocks BLK0 to BLKn (n is a natural number of 1 or larger). The block BLK is a set of a plurality of nonvolatile memory cells associated with bit lines and word lines, and is, for example, a data erase unit. For example, a multi-level cell (MLC) method is adopted for the semiconductor memory device 10, enabling each memory cell to store data of 2 or more bits.

The row decoder modules 12A and 12B can select target block BLK to perform any of various operations based on block addresses held in an address register 15B. The row decoder modules 12A and 12B can transfer a voltage supplied by the voltage generator 19 to the selected block BLK. The row decoder modules 12A and 12B will be described below in detail.

The sense amplifier module 13 can output data DAT read from the memory cell array 11 to an external controller via the input/output circuit 14. The sense amplifier module 13 can transfer write data DAT received from the external controller via the input/output circuit 14, to the memory cell array 11.

The input/output circuit 14 can transmit and receive, for example, input/output signals I/O (I/O1 to I/O8) each with an 8-bit width to and from the external controller. For example, the input/output circuit 14 transfers the write data DAT included in the input/output signal I/O received from the external controller, to the sense amplifier module, and transmits the read data DAT transferred from the sense amplifier module 13, to the external controller.

The register 15 includes a status register 15A, an address register 15B, and a command register 15C. The status register 15A holds, for example, status information STS on the sequencer 17 and transfers the status information STS to the input/output circuit 14 based on an indication from the sequencer 17. The address register 15B holds address information ADD transferred from the input/output circuit 14. A block address, a column address, and a page address included in the address information ADD are used by the row decoder module 12, the sense amplifier module 13, and the voltage generator 19, respectively. The command register 15C holds a command CMD transferred from the input/output circuit 14.

The logic controller 16 can control the input/output circuit 14 and the sequencer 17 based on various control signals received from the external controller. The various control signals used include, for example, a chip enable signal /CE, a command latch enable signal CLE, an address latch enable signal ALE, a write enable signal /WE, a read enable signal /RE, and a write protect signal /WP. The signal /CE is a signal used to enable the semiconductor memory device 10. The signal CLE is a signal notifying the input/output circuit 14 that a signal input to the semiconductor memory device 10 in parallel with the asserted signal CLE is the command CMD. The signal ALE is a signal notifying the input/output circuit 14 that a signal input to the semiconductor memory device 10 in parallel with the asserted signal ALE is the address information ADD. The signals /WE and /RE are signals that instruct the input/output circuit 14, for example, to input and output the input/output signals I/O. The signal /WP is a signal used to set the semiconductor memory device 10 to a protect state, for example, when the semiconductor memory device 10 is powered on and off.

The sequencer 17 can control operations of the semiconductor memory device 10 as a whole based on the command CMD held in the command register 15C. For example, the sequencer 17 controls the row decoder module 12, the sense amplifier module 13, the voltage generator 19, and the like to perform various operations such as a write operation and a read operation.

The ready/busy controller 18 can generate a ready/busy signal RBn based on an operating state of the sequencer 17. The signal RBn is a signal notifying the external controller whether the semiconductor memory device 10 is in a ready state where the semiconductor memory device 10 accepts an instruction from the external controller or in a busy state where the semiconductor memory device 10 does not accept the instruction.

The voltage generator 19 can generate desired voltages based on the control of the sequencer 17 and supply the generated voltages to the memory cell array 11, the row decoder module 12, the sense amplifier module 13, and the like. For example, the voltage generator 19 applies desired voltages to a signal line corresponding to a selected word line and to signal lines corresponding to unselected word lines based on page addresses held in the address register 15B.

[1-1-2] Configuration of the Memory Cell Array 11

Figure 2:
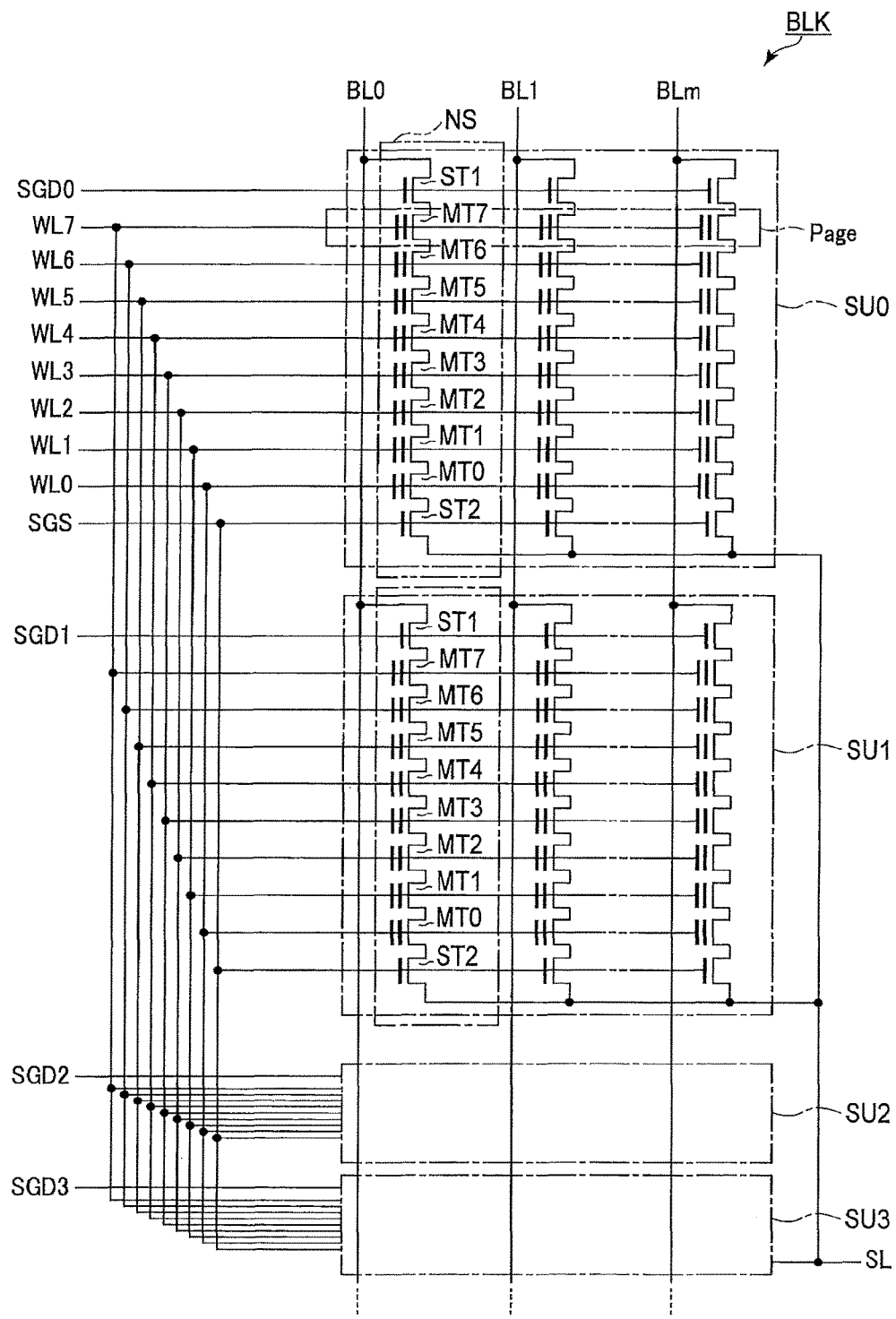
FIG. 2 is a circuit diagram illustrating configuration example of a memory cell array included in the semiconductor memory device according to the first embodiment.

FIG. 2 is a circuit diagram illustrating a configuration example of the memory cell array 11 included in the semiconductor memory device 10 according to the first embodiment. FIG. 2 illustrates an example of a detailed circuit configuration in one block BLK in the memory cell array 11. As illustrated in FIG. 2, the block BLK includes, for example, string units SU0 to SU3.

Each of the string units SU includes a plurality of NAND strings NS. The plurality of NAND strings NS are associated with bit lines BL0 to BLm (m is a natural number of 1 or larger), respectively. Each of the NAND strings NS includes, for example, memory cell transistors MT0 to MT7 and select transistors ST1 and ST2.

The memory cell transistor MT includes a control gate and a charge storage layer and can store data in a nonvolatile manner. The memory cell transistors MT0 to MT7 included in each NAND string NS are connected in series between a source of the select transistor ST1 and a drain of the select transistor ST2. Control gates of the memory cell transistors MT0 to MT7 included in the same block BLK are connected commonly to the word lines WL0 to WL7, respectively. A set of 1-bit data stored in a plurality of memory cell transistors MT connected to the common word line WL in each string unit SU is hereinafter referred to as a "page". Therefore, if 2-bit data is stored in one memory cell transistor MT, a plurality of memory cell transistors MT connected to the common word line WL in one string unit SU stores 2-page data.

The select transistors ST1 and ST2 are used to select one of the string units SU for any of various operations. Drains of the select transistors ST1 included in the NAND strings NS corresponding to the same column address are connected commonly to the corresponding bit line BL. Gates of the select transistors ST1 included in the string units SU0 to SU3 are connected commonly to select gate lines SGD0 to SGD3, respectively. In the same block BLK, sources of the select transistors ST2 are connected commonly to a source line SL, and gates of the select transistors ST2 are connected commonly to select gate line SGS.

In the above-described circuit configuration of the memory cell array 11, the word lines WL0 to WL7 are provided for each block BLK. The bit lines BL0 to BLm are shared among a plurality of the blocks BLK. The number of the string units SU included in each block BLK and the numbers of the memory cell transistors MT and select transistors ST1 and ST2 included in each NAND string NS are only illustrative and may be optionally designed to have any values. The numbers of the word lines WL and select gate lines SGD and SGS are varied based on the numbers of the memory cell transistors MT and select transistors ST1 and ST2.

Figure 3:
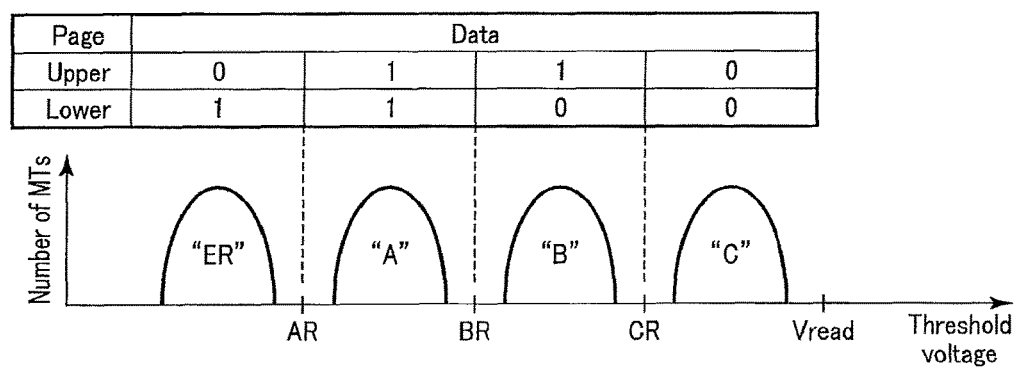
FIG. 3 is a diagram illustrating an example of a threshold distribution and a data allocation for memory cell transistors included in the semiconductor memory device according to the first embodiment.

In the above-described circuit configuration of the memory cell array 11, a threshold distribution formed by threshold voltages of a plurality of memory cell transistors MT connected to the common word line WL in one string unit SU is, for example, as illustrated in FIG. 3. FIG. 3 illustrates an example of a threshold distribution, a read voltage, and data allocation obtained when one memory cell transistor MT stores 2-bit data. An axis of ordinate corresponds to the number of memory cell transistors MT, and an axis of abscissas corresponds to a threshold voltage Vth of each memory cell transistor MT.

As illustrated in FIG. 3, a plurality of memory cell transistors MT forms four threshold distributions based on the stored 2-bit data. The four threshold distributions are referred to as an "ER" level, an "A" level, a "B" level, and a "C" level in the order of increasing threshold voltage. In the MLC method, for example, "10 (lower, upper)" data, "11" data, "01" data, and "00" data are assigned to the "ER" level, the "A" level, the "B" level, and the "C" level, respectively.

In the above-described threshold distributions, read voltages are each set between the adjacent threshold distributions. For example, a read voltage AR is set between the maximum threshold voltage at the "ER" level and the minimum threshold voltage at the "A" level and used for an operation of determining whether the threshold voltage of the memory cell transistor MT is included in the threshold distribution at the "ER" level or in the threshold distribution at the "A" level or higher. Other read voltages BR and CR are set similarly to the read voltage AR. A read pass voltage Vread is set as a voltage higher than the maximum threshold voltage in the highest threshold distribution. The memory cell transistor MT with the read pass voltage Vread applied to the gate thereof is set to an on state regardless of the data stored therein.

The number of bits in the data stored in one memory cell transistor MT and the data assignment to the threshold distributions of the memory cell transistors MT are only illustrative and are not limited to those described above. For example, data of 1 bit or 3 or more bits may be stored in one memory cell transistor MT or various data assignments may be applied to the threshold distributions.

[1-1-3] Configuration of the Row Decoder Module 12

Figure 4:
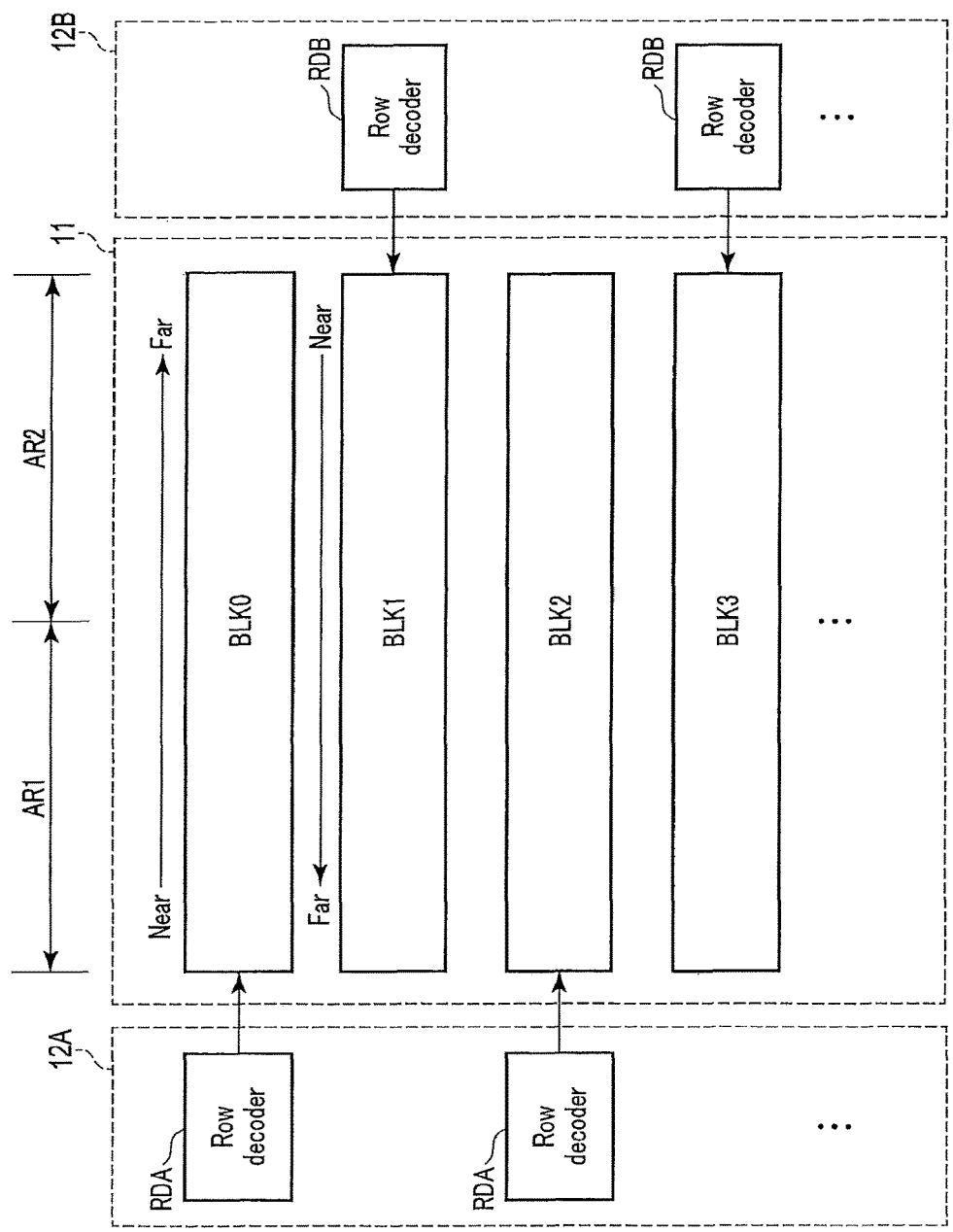
FIG. 4 is a block diagram illustrating a detailed configuration example of a row decoder module included in the semiconductor memory device according to the first embodiment.

FIG. 4 is a block diagram illustrating a configuration example of the row decoder module 12A and 12B included in the semiconductor memory device 10 according to the first embodiment. FIG. 4 illustrates a relationship between each block BLK included in the memory cell array 11 and the row decoder modules 12A and 12B. As illustrated in FIG. 4, the row decoder module 12A includes a plurality of row decoders RDA, and the row decoder module 12B includes a plurality of row decoders RDB.

The plurality of row decoders RDA is provided in association with even-numbered blocks (for example, BLK0, BLK2, . . . ), and the plurality of row decoders RDB is provided in association with odd-numbered blocks (for example, BLK1, BLK3, . . . ). Specifically, for example, the blocks BLK0 and BLK2 are associated with the different row decoders RDA, and the blocks BLK1 and BLK3 are associated with the different row decoders RDB.

A voltage supplied by the voltage generator 19 via one of the row decoders RDA and RDB is applied to each block BLK. The row decoders RDA apply voltages to the word lines WL in the respective even-numbered blocks from a first side of the word lines WL in an extending direction thereof. The row decoders RDB apply voltages to the word lines WL in the respective odd-numbered blocks from a second side of the word lines WL in the extending direction. As illustrated in FIG. 4, areas AR1 and AR2 are defined for the above-described configuration.

The areas AR1 and AR2 are defined by dividing the memory cell array 11 in the extending direction of the word lines WL (an extending direction of the blocks BLK). The area AR1 corresponds to an area on the first side of the word lines WL in the extending direction thereof, and the area AR2 corresponds to an area on the second side of the word lines WL in the extending direction thereof. An area near an area where the row decoder RDA or RDB corresponding to each block BLK is connected to the block BLK is hereinafter referred to as "Near". An area far from the area where the row decoder RDA or RDB is connected to the block BLK is hereinafter referred to as "Far". In other words, for example, in the block BLK0, the area AR1 corresponds to the Near side, and the area AR2 corresponds to the Far side. Likewise, in the block BLK1, the area AR2 corresponds to the Near side, and the area AR1 corresponds to the Far side.

[1-1-4] Configuration of the Sense Amplifier Module 13 and the Voltage Generation Circuit 19

FIG. 5 is a block diagram illustrating a detailed configuration example of the sense amplifier module 13 and voltage generator 19 included in the semiconductor memory device 10 according to the first embodiment. As illustrated in FIG. 5, the sense amplifier module 13 includes a plurality of sense amplifier groups SAG, and the voltage generator 19 includes BLC drivers DR1 and DR2.

The sense amplifier groups SAG include, for example, sense amplifier units SAU0 to SAU7 arrayed along an extending direction of the bit lines BL. One bit line BL is connected to each of the sense amplifier units SAU. In other words, the number of the sense amplifier units SAU included in the sense amplifier module 13 corresponds, for example, to the number of the bit lines BL. A set of the sense amplifier units SAU connected to the bit lines BL corresponding to the NAND strings NS provided in the area AR1 is hereinafter referred to as a sense amplifier segment SEG1. A set of the sense amplifier units SAU connected to the bit lines BL corresponding to the NAND strings NS provided in the area AR2 is referred to as a sense amplifier segment SEG2.

For example, if an even-numbered block is selected in the read operation, the sense amplifier units SAU corresponding to the area AR1 read data from memory cells provided on the Near side of the selected block, and the sense amplifier units SAU corresponding to the area AR2 read data from memory cells provided on the Far side of the selected block. Likewise, if an odd-numbered block is selected in the read operation, the sense amplifier units SAU corresponding to the area AR1 read data from the memory cells provided on the Far side of the selected block, and the sense amplifier units SAU corresponding to the area AR2 read data from memory cells provided on the Near side of the selected block.

The BLC drivers DR1 and DR2 generate control signals BLC1 and BLC2 based on voltages generated by a charge pump not illustrated in the drawings. The BLC driver DR1 supplies the resultant control signal BLC1 to the sense amplifier units SAU included in the segment SEG1. The BLC driver DR2 supplies the resultant control signal BLC2 to the sense amplifier units SAU included in the segment SEG2.

A detailed circuit configuration of each sense amplifier unit SAU described above is, for example, as illustrated in FIG. 6. FIG. 6 illustrates an example of the detailed circuit configuration of one of the sense amplifier units SAU in the sense amplifier module 13. As illustrated in FIG. 6, the sense amplifier unit SAU includes sense amplifier portions SA connected to be able to transmit and receive data to and from one another and latch circuits SDL, LDL, UDL, and XDL.

Each of the sense amplifier portions SA senses data read out onto the corresponding bit line BL to determine whether the read data is "0" or "1". As illustrated in FIG. 6, the sense amplifier portion SA includes a p-channel MOS transistor 20, n-channel MOS transistors 21 to 27, and a capacitor 28.

A first end of the transistor 20 is connected to a power supply line, and a gate of the transistor 20 is connected to a node INV. A first end of the transistor 21 is connected to a second end of the transistor 20, and a second end of the transistor 21 is connected to a node COM, and a control signal BLX is input to a gate of the transistor 21. A first end of the transistor 22 is connected to the node COM, a second end of the transistor 22 is connected to the bit line BL, and a control signal BLC is input to a gate of the transistor 22. A first end of the transistor 23 is connected to the node COM, a second end of the transistor 23 is connected to a node SRC, and a gate of the transistor 23 is connected to the node INV. A first end of the transistor 24 is connected to the second node of the transistor 20, a second end of the transistor 24 is connected to a node SEN, and a control signal HLL is input to a gate of the transistor 24. A first end of the transistor 25 is connected to the node SEN, a second end of the transistor 25 is connected to the node COM, and a control signal XXL is input to agate of the transistor 25. A first end of the transistor 26 is grounded, and a gate of the transistor 26 is connected to the node SEN. A first end of the transistor 27 is connected to a second end of the transistor 26, a second end of the transistor 27 is connected to a bus LBUS, and a control signal STB is input to a gate of the transistor 27. A first end of the capacitor 28 is connected to the node SEN, and a clock CLK is input to a second end of the capacitor 28.

The latch circuits SDL, LDL, UDL, and XDL can temporarily hold the read data, and the latch circuit XDL is connected to the input/output circuit 14 and used to input and output data between the sense amplifier unit SAU and the input/output circuit 14. As illustrated in FIG. 6, the latch circuit SDL includes inverters 30 and 31 and re-channel MOS transistors 32 and 33.

The inverter 30 includes an input terminal connected to the node INV and an output terminal connected to a node LAT. The transistor 32 includes a first end connected to the node INV, a second end connected to the bus LBUS, and a gate to which a control signal STI is input. The transistor 33 includes a first end connected to the node LAT, a second end connected to the bus LBUS, and a gate to which a control signal STL is input. A circuit configuration of each of the latch circuits LDL, UDL, and XDL is similar to, for example, the circuit configuration of the latch circuit SDL, and will thus not be described below.

In the configuration of the sense amplifier unit SAU described above, for example, a voltage Vdd corresponding to a power supply voltage of the semiconductor memory device 10 is applied to the power supply line connected to the first end of the transistor 20. A voltage Vss corresponding to a ground voltage of the semiconductor memory device 10 is applied to the node SRC. The various control signals described above are generated by, for example, the sequencer 17.

The configuration of the sense amplifier module 13 according to the first embodiment is not limited to this. For example, the number of the latch circuits provided in the sense amplifier unit SAU may be designed to have any value. In this case, the number of the latch circuits is designed based on the number of bits in the data held by one memory cell transistor MT. By way of example, the case where the sense amplifier units SAU correspond to the bit lines BL on a one-to-one basis has been described. However, the present invention is not limited to this. For example, a plurality of bit lines BL may be connected to one sense amplifier unit SAU via a selector.

[1-1-5] Structure of the Semiconductor Memory Device 10

The structures of the memory cell array 11, row decoder module 12, and sense amplifier module 13 included in the semiconductor memory device 10 according to the first embodiment will be described.

FIG. 7 illustrates an example of a plane layout of the memory cell array 11 according to the first embodiment.

FIG. 7 illustrates an example of a plane layout of one string unit SU0 in the memory cell array 11. In the drawings described below, an X axis corresponds to the extending direction of the word lines WL, a Y axis corresponds to the extending direction of the bit lines BL, and a Z axis corresponds to a vertical direction with respect to a substrate surface.

As illustrated in FIG. 7, the string unit SU0 is provided between contact plugs LI extending in the X direction and located adjacent to each other in the Y direction. Each of the contact plugs LI is provided in a slit which insulates the adjacent string units SU from each other. In other words, in an area not illustrated in the drawings in the memory cell array 11, an array of a plurality of contact plugs LI is provided in the Y direction, and the string units SU are each provided between the adjacent contact plugs LI.

In such a configuration of the string unit SU0, an area CR and an area HR are defined in the X direction. The area CR is an area functioning as a substantial data holding area, and the area CR is provided with a plurality of semiconductor pillars MH. One semiconductor pillar MH corresponds to, for example, one NAND string NS. The area HR is an area where various interconnects provided in the string unit SU0 are connected to the row decoder module 12A. Specifically, the string unit SU0 is provided with, for example, a conductor 41 functioning as a select gate line SGS, eight conductors 42 functioning as the word lines WL0 to WL7, and a conductor 43 functioning as a select gate line SGD in such a manner that each of the conductors includes a portion which overlaps none of the upper-layer conductors. Ends of the conductors 41 to 43 are connected, via respective conductive via contacts VC, to the row decoder module 12A provided below the string unit SU.

Figure 8:
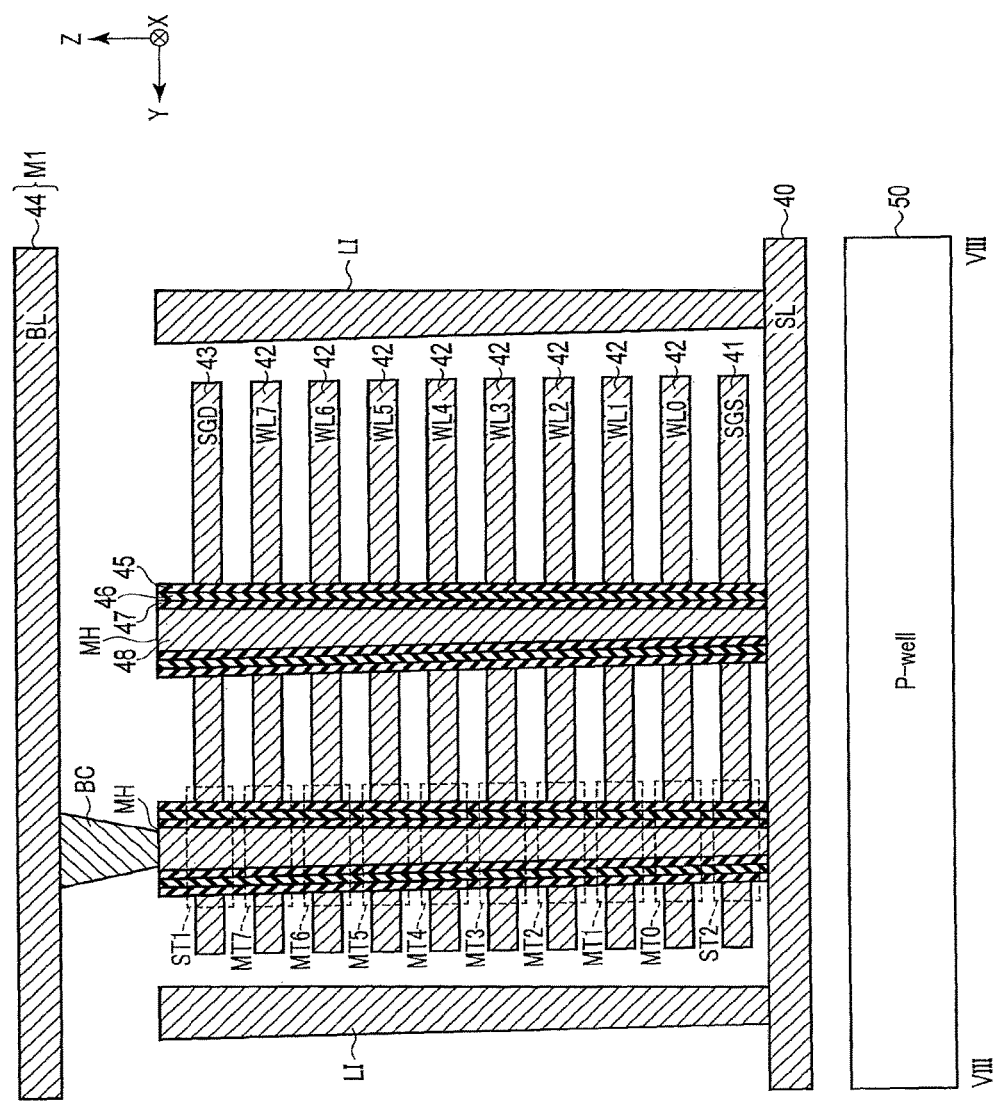
FIG. 8 is a cross-sectional view of the memory cell array taken along line VIII-VIII illustrated in FIG. 7.
Figure 9:
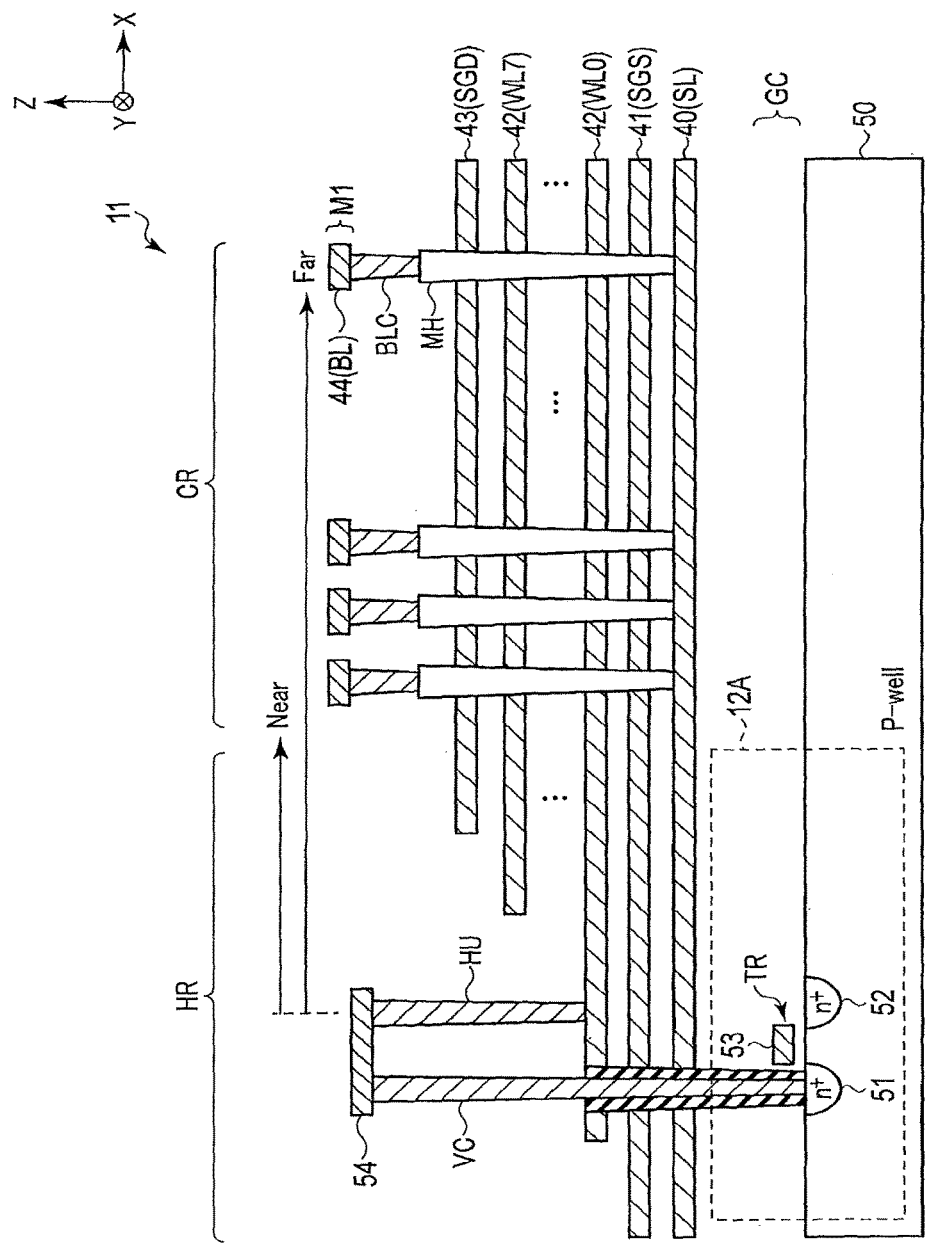
FIG. 9 is a diagram illustrating an example of a sectional structure of the memory cell array and the row decoder module included in the semiconductor memory device according to the first embodiment.

An example of a sectional structure of the memory cell array 11 described above is illustrated in FIG. 8 and FIG. 9. FIG. 8 and FIG. 9 illustrate an example of a sectional structure of one string unit SU0 in the memory cell array 11, and FIG. 8 illustrates a cross section taken along line VIII-VIII in FIG. 7. FIG. 9 illustrates a cross section taken along the X direction in FIG. 7 and depicts a structure in the area HR associated with the word line WL0 (the conductor 42), the structure being extracted from FIG. 7. Illustration of interlayer insulating films is omitted in the drawings described below, and the structure of the semiconductor pillars MH in the area CR is omitted from FIG. 9.

As illustrated in FIG. 8, the memory cell array 11 includes a conductor 40 provided above a P-type well area 50 formed on a semiconductor substrate and functioning as a source line SL. The conductor 40 is provided with a plurality of the contact plugs LI thereon. Between the adjacent contact plugs LI and above the conductor 40, for example, a conductor 41, eight layers of conductors 42, and a conductor 43 are provided in this order in the Z direction.

The conductors 40 to 43 are each shaped like a plate spreading in the X direction and the Y direction. The contact plugs LI are each shaped like a plate spreading in the X direction and the Z direction. A plurality of semiconductor pillars MH is provided to extend through the conductors 41 to 43. Specifically, the semiconductor pillars MH are formed to extend from a top surface of the conductor 43 to a top surface of the conductor 40.

Each of the semiconductor pillars MH includes, for example, a block insulating film 45, an insulating film (a charge storage layer) 46, a tunnel oxide film 47, and a conductive semiconductor material 48. Specifically, the tunnel oxide film 47 is provided around the semiconductor material 48, the insulating film 46 is provided around the tunnel oxide film 47, and the block insulating film 45 is provided around the insulating film 46. The semiconductor material 48 may contain a different material.

In such a structure, a portion of the conductor 41 which intersects the semiconductor pillar MH functions as the select transistor ST2. A portion of the conductor 42 which intersects the semiconductor pillar MH functions as the memory cell transistor MT. A portion of the conductor 43 which intersects the semiconductor pillar MH functions as the select transistor ST1.

A conductive via contact BC is provided on the semiconductor material 48 of the semiconductor pillar MH. A conductor 44 functioning as the bit line BL is provided on the via contact BC in such a manner as to extend in the Y direction. In each string unit SU, one semiconductor pillar MH is connected to one conductor 44. In other words, in each string unit SU, for example, different semiconductor pillars MH are connected to the respective conductors 44 arrayed in the X direction.

As illustrated in FIG. 9, $n^+$ impurity diffusion areas 51 and 52 are formed in a front surface of a P-type well area 50 in the area HR. A conductor 53 is provided between the diffusion areas 51 and 52 and on the P-type well area 50, via a gate insulating film not illustrated in the drawings. The diffusion areas 51 and 52 and the conductor 53 function as a source electrode, a drain electrode, and a gate electrode of a transistor TR. The transistor TR is included in the row decoder module 12A. A via contact VC is provided on the diffusion area 51. The via contact VC extends through the conductors 40 to 42 and is connected to a conductor 54. The via contact VC is insulated from the conductors 40 to 42 by an insulating film. The conductor 54 is provided, for example, in an interconnect layer between an interconnect layer where the conductor 43 is provided and an interconnect layer where the conductor 44 is provided. The via contact VC is connected to the conductor 42 corresponding to the word line WL0 via the conductive via contact HU. A spacing between the via contact HU and the semiconductor pillar MH varies according to an area where the semiconductor pillar MH is provided. The Near side and the Far side described using FIG. 4 are defined based on the distance between the via contact HU and the semiconductor pillar MH. Specifically, the spacing in the X direction between the via contact HU connected to any one of the conductors 42 and the semiconductor pillar MH provided on the Near side is shorter than the spacing in the X direction between the via contact HU and the semiconductor pillar MH provided on the Far side.

In such a configuration, the row decoder module 12A can supply a voltage to the conductor 42 corresponding to the word line WL0 via the transistor TR. The semiconductor memory device 10 is provided with a plurality of the transistors TR and a plurality of the conductors 54 none of which are illustrated in the drawings, in association with the conductors 41 to 43. The row decoder module 12A supplies a voltage to the conductors corresponding to the various interconnects via the transistors TR. An interconnect layer where the conductor 53 corresponding to the gate electrode of the transistor TR is formed is referred to as an interconnect layer GC. An interconnect layer where the conductor 44 corresponding to the bit line BL is formed is referred to as an interconnect layer M1.

A plane layout of the string unit SU corresponding to the odd-numbered block BLK corresponds to, for example, reversal of the planar layout of the string unit SU illustrated in FIG. 7, using the Y axis as an axis of symmetry. In other words, the cell area CR is provided between the hookup area HR corresponding to the even-numbered block and the hookup area HR corresponding to the odd-numbered block. The remaining part of the structure of the string unit SU corresponding to the odd-numbered block BLK is similar to the structure of the string unit SU corresponding to the even-numbered block, and thus, description of the remaining part is omitted.

The structure of the memory cell array 11 according to the first embodiment is not limited to the above-described structure. For example, in the above description, the select gate lines SGS and SGD include the one layer of the conductor 41 and the one layer of the conductor 43, respectively, the select gate lines SGS and SGD may each include a plurality of layers of the conductors. The number of conductors 42 through which one semiconductor pillar MH extends is not limited to this. For example, when one semiconductor pillar MH extends through nine or more conductors 42, nine or more memory cell transistors MT can be included in one NAND string NS.

Now, a sectional structure of the sense amplifier module 13 will be described using FIG. 10. FIG. 10 illustrates an example of a sectional structure of an area where the gate electrode of the transistor 22 included in the sense amplifier module 13 is formed. As illustrated in FIG. 10, conductors 55A and 55B functioning as the gate electrode of the transistor 22 are provided on the P-type well area 50 via a gate insulating film not illustrated in the drawings.

The conductors 55A and 55B are provided in the interconnect layer GC, the conductor 55A extends over an area AR1 in the X direction, and the conductor 55B extends over an area AR2 in the X direction. The conductor 55A and the conductor 55B are insulated from each other by a slit ST. A via contact TRC is provided on an end portion of the conductor 55A, and a conductor 56A is provided on the via contact TRC. A via contact TRC is provided on an end portion of the conductor 55B, and a conductor 56B is provided on the via contact TRC. The conductors 56A and 56B are formed, for example, in an interconnect layer M2 above the interconnect layer M1.

The conductors 56A and 56B are connected to BLC drivers DR1 and DR2 in an area not illustrated in the drawings. In other words, the BLC driver DR1 applies a voltage corresponding to a control signal BLC1 via the conductor 56A and the via contact TRC, and the BLC driver DR2 applies a voltage corresponding to a control signal BLC2 via the conductor 56B and the via contact TRC. By way of example, the case where the conductor 55 and the conductor 56 are connected together via one via contact TRC has been described. However, the present invention is not limited to this. For example, the conductor 55 and the conductor 56 may be connected together via a plurality of via contacts TRC.

[1-2] Operations

The semiconductor memory device 10 according to the first embodiment performs a kick operation in the read operation. The kick operation is a voltage application method of temporarily setting a driving voltage of a driver to a value higher than a target voltage value, and when a given time has elapsed, reducing the driving voltage down to the target voltage value. The kick operation is performed, for example, on the word line WL or the control signals BLX and BLC. For example, when the kick operation is performed on the control signals BLX and BLC, the amount of current supplied to each bit line BL increases to charge the bit line BL. A voltage which is higher than the target voltage and which is applied before the target voltage is applied is hereinafter referred to as a kick voltage. A difference between the target voltage and the kick voltage is hereinafter referred to as a kick amount.

According to the first embodiment, when the kick operation is performed on the control signal BLC, a control method for the control signals BLC1 and BLC2 vary depending on whether an even-numbered block or an odd-numbered block is selected.

FIG. 11 illustrates an example of the control method for the control signals BLC1 and BLC2 during a period when the kick operation is performed on the word line WL. As illustrated in FIG. 11, when the selected block is an odd-numbered block, the sequencer 17 performs the kick operation on the control signal BLC1, while not performing the kick operation on the control signal BLC2. On the other hand, when the selected block is an odd-numbered block, the sequencer 17 performs the kick operation on the control signal BLC2, while not performing the kick operation on the control signal BLC1.

In other words, the sequencer 17 of the semiconductor memory device 10 controls the BLC drivers DR1 and DR2 in such a manner that the kick operation is performed on the control signal BLC supplied to the sense amplifier segment SEG corresponding to the Near side and not performed on the control signal BLC supplied to the sense amplifier segment SEG corresponding to the Far side.

FIG. 12 illustrates examples of waveforms in the read operation of the semiconductor memory device 10 according to the first embodiment. FIG. 12 illustrates examples of the waveforms for the selected word line WL, the waveforms for the bit lines BL corresponding to the Near side and the Far side, and the waveforms of various control signals, the waveforms all corresponding to the block BLK of interest. For the waveforms for the word line WL illustrated in FIG. 12, the solid line corresponds to a waveform associated with the Near side, and the dashed line corresponds to a waveform associated with the Far side. For the waveforms of the control signal BLC, the solid line corresponds to a waveform of the control signal BLC1, and the dashed line corresponds to a waveform of the control signal BLC2. In the description below, when the control signal BLC1 and BLC2 need not be distinguished from each other, operations of the control signals BLC1 and BLC2 are collectively described as the operation of the control signal BLC.

In the description below, an N-channel MOS transistor to which various control signals are input is assumed to be set to the on state when an "H" level voltage is applied to a gate of the transistor and to an off state when an "L" level voltage is applied to the gate of the transistor. The memory cell transistor MT corresponding to the selected word line WL is referred to as a selected memory cell.

As illustrated in FIG. 12, in an initial state preceding a time t0, for example, the voltages of the word lines WL and the control signals BLX and BLC1 are set to the voltage Vss, the voltages of the control signals HLL, XXL, and STB are set to the "L" level, and the voltage of each bit line BL is set to the voltage Vss.

At the time t0, when the read operation is started, the row decoder module 12 applies, For example, the read pass voltage Vread to the selected word line WL. Variation in the voltage of the word line WL is faster on the Near side than on the Far side.

The sequencer 17 sets the voltage of the control signal BLC to a voltage VblxL and sets the voltage of the control signal BLC to a voltage VblcL. Then, the memory cell transistor MT with the voltage Vread applied thereto, the transistor 21 with the voltage VblxL applied thereto, and the transistor 22 with the voltage VblcL applied thereto are set to the on state. Consequently, the sense amplifier module 13 supplies a current to the bit line BL, and the voltage of the bit line BL increases to a voltage VBLL.

At a time t1, the sequencer 17 sets the voltage of the control signal BLX to a voltage Vblx, sets the voltage of the control signal BLC to a voltage Vblc, and sets the control signal HLL to the "H" level. The voltage Vblx is higher than the voltage VblxL, and the voltage Vblc is higher than the voltage VblcL. At this time, the sequencer 17 may perform the kick operation, for example, on the control signals BLX and BLC. In this case, for example, a voltage higher than the desired voltage by an amount equal to a voltage BLkick is temporarily applied to the control signals BLX and BLC. The transistors 21 and 22 with the voltage of the gate increased allow more current to pass through, increasing the voltage of the bit line BL. If the selected memory cell is in the on state, the voltage of the bit line BL changes to a voltage VBLon. If the selected memory cell is in the off state, the voltage of the bit line BL changes to a voltage VBLoff higher than the voltage VBLon. When the control signal HLL is set to the "H" level, the transistor 24 is set to the on state to charge the node SEN. When charging of the node SEN is completed, the sequencer 17 sets the control signal HLL to the "L" level.

At a time t2, the sequencer 17 sets the control signal XXL to the "H" level. When the control signal XXL is set to the "H" level, the potential of the node SEN changes based on the state of the selected memory cell. The sequencer 17 then sets the control signal STB to the "H" level and determines whether or not the threshold voltage of the selected memory cell is equal to or higher than the voltage AR based on the state of the node SEN. The sequencer 17 holds the result of the determination in the latch circuit in the sense amplifier unit SAU. Subsequently, the sequencer 17 sets the control signal XXL to the "L" level.

At a time t3, the row decoder module 12A applies, for example, the read voltage CR to the word line WL. At this time, the kick operation is applied to the word line WL and to the control signals BLX and BLC1. Specifically, the row decoder module 12A temporarily applies a kick voltage CR+CGkick to the selected word line WL. The kick voltage CR+CGkick appears, for example, as the Near-side voltage of the word line WL. On the other hand, the Far-side voltage of the word line WL, for example, increases up to the voltage CR without exceeding the voltage CR due to a RC delay in the interconnects. The magnitude of the kick amount CGkick can be set to any numerical value.

During a period when the kick voltage is applied to the selected word line WL, the sequencer 17, for example, temporarily increases the voltage of the control signal BLX by an amount equal to a voltage BLkick, temporarily increases the voltage of the control signal BLC1 by an amount equal to a voltage BLkickh higher than the voltage BLkick, and maintains the voltage of the control signal BLC2 at the voltage Vblc.

If the threshold voltage of the selected memory cell corresponding to the Near side is lower than the voltage CR, the selected memory cell with the kick voltage applied thereto maintains the on state or changes from the off state to the on state, thus changing the voltage of each bit line BL to the voltage VBLon. On the other hand, if the threshold voltage of the selected memory cell corresponding to the Near side is equal to or higher than the voltage CR, the Near side voltage of the word line WL is higher than the voltage CR, and thus, the corresponding memory cell may be subjected to false turn-on. The false turn-on refers to a phenomenon in which the memory cell transistor MT having a threshold voltage lower than a predetermined read voltage is unintentionally set to the on state by the kick voltage. At this time, the voltage of the bit line BL may decrease, but returns to the voltage VBLoff in a short time because the kick operation on the control signals BLX and BLC1 has increased the amount of current supplied to the bit line BL.

If the threshold voltage of the selected memory cell corresponding to the Far side is lower than the voltage CR, the selected memory cell with the voltage CR applied thereto maintains the on state or changes from the off state to the on state, thus changing the voltage of the bit line BL to the voltage VBLon. On the other hand, if the threshold voltage of the selected memory cell corresponding to the Far side is equal to or higher than the voltage CR, the Far side voltage of the word line WL is, for example, inhibited from exceeding the voltage CR, thus suppressing possible false turn-on in the corresponding to selected memory cell. In other words, if the threshold voltage of the selected memory cell corresponding to the Far side is equal to or higher than the voltage CR, the voltage of each bit line BL is maintained at the voltage VBLoff. The operation of the control signal HLL at the time t3 is similar to the operation of the control signal HLL at the time t1.

At a time t4, the sequencer 17 sets the control signal XXL to the "H" level. When the control signal XXL is set to the "H" level, the potential of the node SEN changes based on the state of the selected memory cell. The sequencer 17 then sets the control signal STB to the "H" level and determines whether or not the threshold voltage of the selected memory cell is equal to or higher than the voltage CR based on the state of the node SEN. The sequencer 17 holds the result of the determination in the latch circuit in the sense amplifier unit SAU. Subsequently, the sequencer 17 sets the control signal XXL to the "L" level.

At a time t5, the row decoder module 12A and the sequencer 17 restores the word line WL and the control signals BLX and BLC to the initial state to end the read operation on the page.

In the read operation described above, the operations performed if an odd-numbered block is selected are similar to the operations performed if an even-numbered block is selected except that the operation of the row decoder module 12A is performed by the row decoder module 12B instead and that the operation of the control signal BLC1 is replaced with the operation of the control signal BLC2.

[1-3] Effects of the First Embodiment

The semiconductor memory device 10 according to the above-described first embodiment enables the read operation to be performed faster. Effects of the semiconductor memory device 10 according to the first embodiment will be described in detail.

In a semiconductor memory device with memory cells three-dimensionally stacked therein, the conductors 42 formed like plates are used as the word lines WL, for example, as illustrated in FIG. 7 and FIG. 8. The word lines WL with such a structure tend to suffer a long RC delay. When a voltage is applied to one end of the word line WL, a voltage increase speed may vary between an area near the driver (Near side) and an area far from the driver (Far side). Thus, the semiconductor memory device may perform, for example, the kick operation in order to assist in Increasing the voltage on the Far side of the word line WL, which has a relatively low voltage increase speed.

Now, an example of the read operation of the semiconductor memory device according to a comparative example of the first embodiment will be described using FIG. 13.

Figure 13:
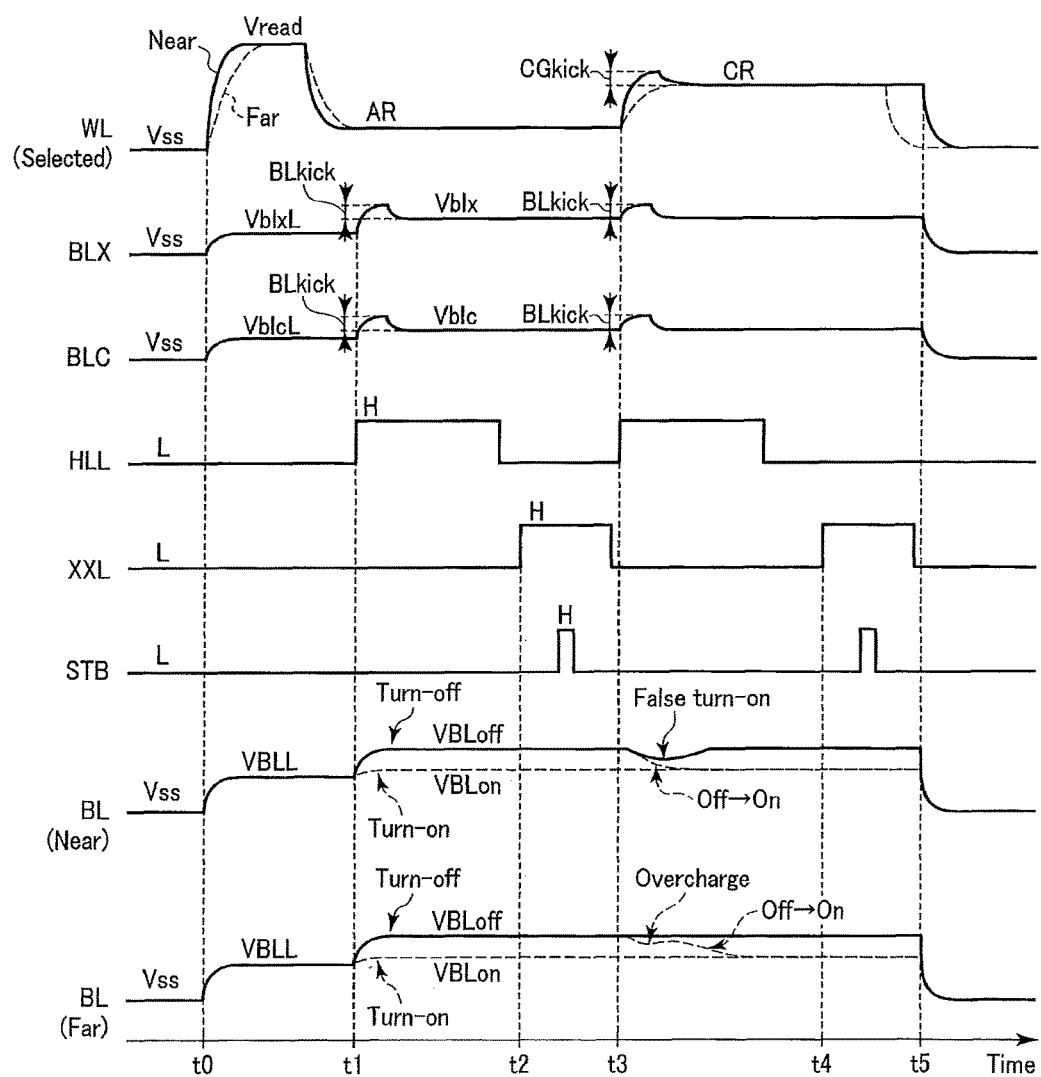
FIG. 13 is a diagram illustrating examples of the waveforms in the read operation in a comparative example of the first embodiment.

FIG. 13 illustrates examples of the waveforms for the Near side and Far side of the word line WL, the waveforms of various control signals, and the waveform for the bit line BL. The waveforms in FIG. 13 are different from the waveforms in the read operation described using FIG. 12 in that the common control signal BLC is used both on the Near side and on the Far side.

As Illustrated in FIG. 13, when the kick operation is performed on the word line WL at the time t3, the voltage on the Near side of the word line WL increases above the voltage CR. Then, if the selected memory cell corresponding to the Near side has a threshold voltage equal to or higher than the voltage CR, the corresponding memory cell may be falsely turned on. The voltage of the bit line BL corresponding to the falsely turned-on memory cell decreases (over discharge) and returns to the voltage VBLoff utilizing charging of the bit line BL resulting from the kick operation on the control signal BLC. A stabilization time provided for the bit line BL taking the effect of the over discharge into account can be reduced with increasing the amount of kick in the control signal BLC.

On the other hand, at the time t3, the voltage on the Far side of the word line WL reaches the voltage CR without exceeding the voltage CR. If the selected memory cell corresponding to the Far side has a threshold voltage lower than the voltage CR, the voltage of the bit line BL corresponding to the memory cell having changed from the off state to the on state decreases from the voltage VBLoff to the voltage VBLon. At this time, each bit line BL is charged under the effect of the kick operation on the control signal BLC (overcharge), and thus, the voltage of the bit line BL decreases to the voltage VBLon, for example, after the kick operation on the control signal BLC ends. The stabilization time provided for the bit line BL taking the effect of the overcharge into account can be reduced consistently with the amount of kick in the control signal BLC.

In this manner, when the kick operation is performed on the word line WL, the optimal amount of kick in the control signal BLC varies between the Near side and the Far side. However, in the comparative example, since the common control signal BLC is used both on the Near side and the Far side, the effect of the over discharge on the Near side is traded off for the effect of the overcharge on the Far side. Thus, in the kick operation on the control signal BLC in the comparative example, an amount of kick BLkick smaller than an optimal amount of kick BLkickh in the control signal BLC is applied to the Near side, for example, in order to provide a nearly equal stabilization time for the bit lines BL corresponding to the Near side and for the bit lines BL corresponding to the Far side.

In contrast, in the semiconductor memory device 10 according to the first embodiment, different control signals BLC are used for the sense amplifier unit SAU corresponding to the Near side of the word line WL and for the sense amplifier unit SAU corresponding to the Far side of the word line WL. The semiconductor memory device 10 according to the first embodiment for example executes control in such a manner as to perform the kick operation on the control signal BLC to be supplied to the sense amplifier unit SAU corresponding to the Near side of the word line WL, while not performing the kick operation on the control signal BLC to be supplied to the sense amplifier unit SAU corresponding to the Far side of the word line WL, when the kick operation is performed on the word line WL in the read operation.

Consequently, the semiconductor memory device 10 according to the first embodiment can, for example, apply a kick voltage higher than a normal kick voltage to the control signal BLC corresponding to the Near side, the bit lines BL corresponding to the Near side can be restrained from being over discharged. The semiconductor memory device 10 according to the first embodiment, for example, does not perform the kick operation on the control signal BLC corresponding to the Far side and can thus suppress overcharging of the bit lines BL corresponding to the Far side. Therefore, the semiconductor memory device 10 according to the first embodiment can reduce the stabilization time for the voltage of each bit line BL when the kick operation is performed on the word line WL, enabling an increase in the speed of the read operation. By way of example, the case has been described where, when the kick operation is performed on the word line WL, the BLC driver DR1 corresponding to the Near side performs the kick operation, whereas the BLC driver DR2 corresponding to the Far side does not perform the kick operation. However, the present invention is not limited to this. For example, both the BLC driver DR1 corresponding to the Near side and the BLC driver DR2 corresponding to the Far side may perform the kick operation, with a difference in the amount of kick between the BLC drivers DR1 and DR2. In this case, For example, the kick voltage in the BLC driver DR1 corresponding to the Near side is set higher than the kick voltage in the BLC driver DR2 corresponding to the Far side. Even in such a case, the semiconductor memory device 10 can produce effects similar to the above-described effects.

[2] Second Embodiment

In the semiconductor memory device 10 according to the second embodiment, the sense amplifier module 13 is divided into three areas in each of which the control signal BLC is controlled. The semiconductor memory device 10 according to the second embodiment will be described in conjunction with differences from the first embodiment.

[2-1] Configuration

Figure 14:
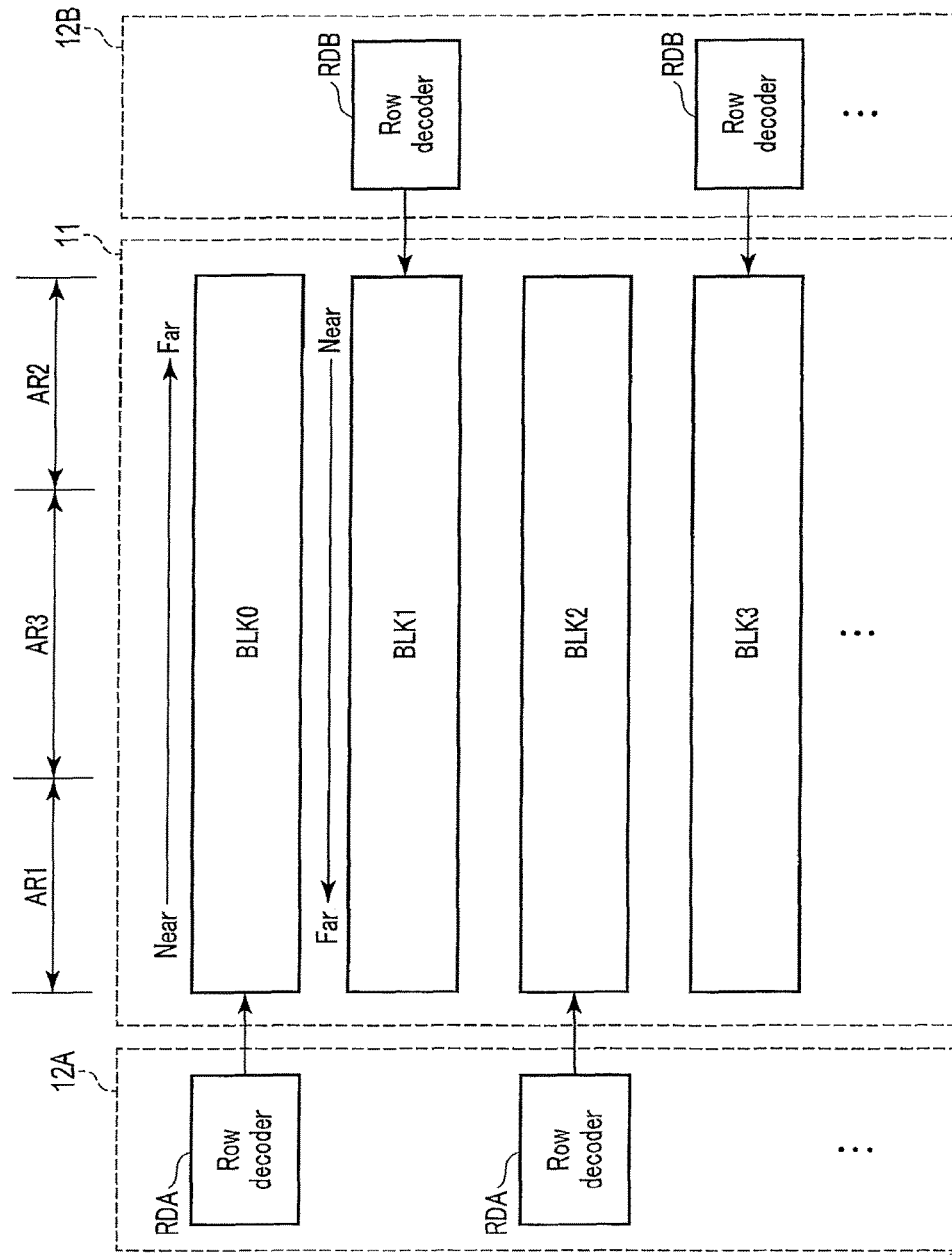
FIG. 14 is a block diagram illustrating a detailed configuration example of a memory cell array and a row decoder module included in a semiconductor memory device according to a second embodiment.

FIG. 14 is a block diagram illustrating a configuration example of the memory cell array 11 and the row decoder module 12 included in the semiconductor memory device 10 according to the second embodiment. The configuration in FIG. 14 is different from the configuration described in the first embodiment using FIG. 4 in the extents of the defined areas.

Specifically, as illustrated in FIG. 14, the memory cell array 11 according to the second embodiment includes an area AR3 defined between the area AR1 and the area AR2. The area AR3 is provided, for example, in such a manner that a distance from the row decoder RDA to the area AR3 in the even-numbered block BLK is similar to a distance from the row decoder RDB to the area AR3 in the odd-numbered block BLK. In other words, the position of the area AR3 in each block is defined, for example, in such a manner that the distance from the corresponding row decoder includes an intermediate position between "Near" and "Far".

In other words, a spacing between the via contact HU connected to any one of the conductors 42 and the semiconductor pillar MH provided in the area AR3 in the extending direction of the word line WL is longer than a spacing between the via contact HU and the semiconductor pillar MH provided on the Near side in the extending direction of the word line WL and shorter than a spacing between the via contact HU and the semiconductor pillar MH provided on the Far side in the extending direction of the word line WL.

FIG. 15 is a block diagram illustrating a detailed configuration example of the sense amplifier module 13 and the voltage generator 19 included in the semiconductor memory device 10 according to the second embodiment. The configuration in FIG. 15 is different from the configuration described in the first embodiment using FIG. 5 in that the sense amplifier module 13 further includes a sense amplifier segment SEG3 and that the voltage generator 19 further includes a BLC driver DR3.

As illustrated in FIG. 15, the segment SEG3 is provided between the segment SEG1 and the segment SEG3. The sense amplifier units SAU included in the segment SEG3 is connected to the bit lines BL corresponding to the NAND strings NS provided in the area AR3. The BLC driver DR3 generates a control signal BLC3 based on a voltage generated by a charge pump not illustrated in the drawings. The BLC driver DR3 supplies the resultant control signal BLC3 to the sense amplifier units SAU included in the segment SEG3.

Figure 16:
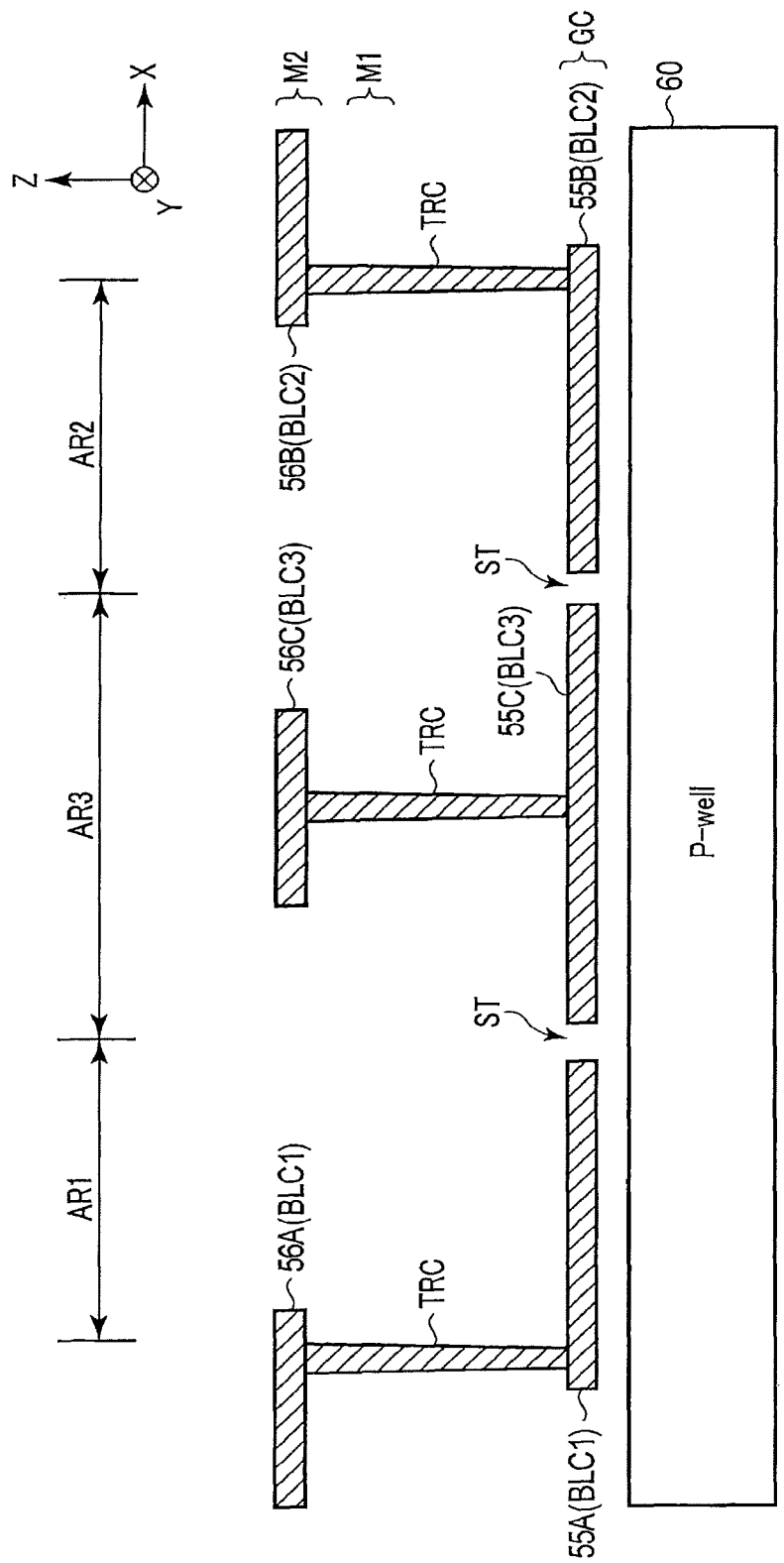
FIG. 16 is a diagram illustrating an example of a sectional structure of the sense amplifier module included in the semiconductor memory device according to the second embodiment.

FIG. 16 is a diagram illustrating an example of a sectional structure of the sense amplifier module 13 included in the semiconductor memory device 10 according to the second embodiment. In this structure, the configuration corresponding to the area AR3 is added to the configuration described in the first embodiment using FIG. 10.

Specifically, in the second embodiment as illustrated in FIG. 16, a conductor 55C is provided on the P-type well area 50 via a gate insulating film not illustrated in the drawings. The conductor 55C extends over the area AR3 in the X direction, and is arranged between the conductor 55A and the conductor 55B. The conductor 55C and each of the conductors 55A and 55B are insulated from each other by the slit ST. The via contact TRC is provided on the conductor 55C, and a conductor 56C is provided on the via contact TRC. The conductor 56C is formed, for example, in the interconnect layer M2 and connected to the BLC driver DR3 in an area not illustrated in the drawings. In other words, the BLC driver DR3 applies a voltage corresponding to the control signal BLC3 via the conductor 56C and the via contact TRC. The remaining part of the configuration of the semiconductor memory device 10 according to the second embodiment is similar to the corresponding part of the configuration of the semiconductor memory device 10 according to the first embodiment, and will thus not be described below.

[2-2] Operations

A read operation of the semiconductor memory device 10 according to the second embodiment is similar to the read operation of the semiconductor memory device 10 according to the first embodiment to which operations corresponding to the sense amplifier segment SEG3 are added. Specifically, like the semiconductor memory device 10 according to the first embodiment, the semiconductor memory device 10 according to the second embodiment controllably determines whether or not to perform the kick operation on the control signal BLC for each sense amplifier segment SEG during the period when the kick operation is performed on the word line WL. FIG. 17 illustrates an example of a control method for the kick operation for each segment SEG according to the second embodiment.

As illustrated in FIG. 17, if the selected block is the even-numbered block BLK, the kick operation is performed on the control signal BLC1 and not performed on the control signal BLC2 or BLC3. On the other hand, if the selected block is an odd-numbered block, the kick operation is performed on the control signal BLC2 and not performed on the control signal BLC1 or BLC3. In other words, the sequencer 17 of the semiconductor memory device 10 controls the BLC drivers DR1 to DR3 in such a manner as to perform the kick operation on the segment SEG corresponding to the Near side of each word line WL in the selected block, while not performing the kick operation on the segment SEG corresponding to the Far side of each word line WL in the selected block and on the segment SEG3 corresponding to a portion of each word line WL in the center of the block BLK. The other operations of the semiconductor memory device 10 according to the second embodiment are similar to the corresponding operations of the semiconductor memory device 10 according to the first embodiment, and will thus not be described below.

[2-3] Effects of the Second Embodiment

As described above, like the semiconductor memory device 10 according to the first embodiment, the semiconductor memory device 10 according to the second embodiment controls the control signals BLC corresponding to the segments SEG1 and SEG2 corresponding to the Near side or the Far side and further controls the control signal BLC3 for the segment SEG3 between the segment SEG1 and the segment SEG2. Specifically, the semiconductor memory device 10 according to the second embodiment can control the BLC driver DR3 to allow, for example, the control signal BLC3 corresponding to the segment SEG3 to perform the same operation as that executed on one of the Near and Far sides.

In this manner, the semiconductor memory device 10 according to the second embodiment can controllably determine whether or not to perform the kick operation in a more detailed manner than the semiconductor memory device 10 according to the first embodiment, based on the distance from the row decoder module 12. Therefore, as is the case with the first embodiment, the semiconductor memory device 10 according to the second embodiment can reduce the stabilization time for the voltage of each bit line BL upon performing the kick operation on the word line WL, enabling an increase in the speed of the read operation.

By way of example, the case has been described where the control signal BLC3 corresponding to the segment SEG3 performs the same operation as that executed on one of the Near and Far sides. However, the present invention is not limited to this. For example, the sequencer 17 may perform the kick operation on the control signal BLC3 regardless of the selected block and set the amount of kick in the control signal BLC3 during the kick operation smaller than the amount of kick in the control signal BLC corresponding to the Near-side segment SEG. Even in such a case, the semiconductor memory device 10 according to the second embodiment can produce the effects described above.

[3] Third Embodiment

The semiconductor memory device 10 according to a third embodiment includes a variable resistor provided for an interconnect through which the control signal BLC is supplied, to adjust the amount of kick in the control signal BLC for each sense amplifier segment SEG. The semiconductor memory device 10 according to the third embodiment will be described below in conjunction with differences from the first and second embodiments.

[3-1] Configuration

FIG. 18 is a block diagram illustrating a configuration example of the memory cell array 11 and the row decoder module 12 included in the semiconductor memory device 10 according to a third embodiment. The configuration in FIG.

18 is different from the configuration described in the first embodiment using FIG. 4 in the extents of the defined areas.

Specifically, as illustrated in FIG. 18, areas AR1 to AR5 are defined in the memory cell array 11 according to the second embodiment. Specifically, the areas AR1 to AR5 are areas defined along the extending direction of the block BLK. The area AR1 corresponds to a row decoder module 12A-side area, and the area AR5 corresponds to a row decoder module 12B-side area. In other words, for example, in the block BLK0, the area AR1 corresponds to the Near side, and the area AR5 corresponds to the Far side. Similarly, in the block BLK1, the area AR5 corresponds to the Near side, and the area AR1 corresponds to the Far side.

FIG. 19 is a block diagram illustrating a detailed configuration example of the sense amplifier module 13 and the voltage generator 19 included in the semiconductor memory device 10 according to the third embodiment. As illustrated in FIG. 19, in the third embodiment, the sense amplifier module 13 includes, for example, sense amplifier segments SEG1 to SEG5, select transistors 60 and 61, and variable resistors 62A to 62D.

Sense amplifier groups SAG1 to SAG5 each include the sense amplifier units SAU connected to the bit lines BL corresponding to the NAND strings NS provided in the corresponding one of the areas AR1 to AR5. A first end of the select transistor 60 is provided with the control signal BLC1 by the BLC driver DR1. A first end of the select transistor 61 is provided with the control signal BLC2 by the BLC driver DR2. Control signals SELL and SELR are input to gates of the select transistors 60 and 61, respectively. The variable resistors 62A to 62D are connected in series between a second end of the select transistor 60 and a second end of the select transistor 61. The variable resistor 62A includes a transistor 63A and a resistance element 64A connected in parallel between a node ND1 and a node ND2. The variable resistor 62B includes a transistor 63B and a resistance element 64B connected in parallel between the node ND2 and a node ND3. The variable resistor 62C includes a transistor 63C and a resistance element 64C connected in parallel between the node ND3 and a node ND4. The variable resistor 62D includes a transistor 63D and a resistance element 64D connected in parallel between the node ND4 and a node ND5. Control signals S1 to S4 are input to gates of the transistors 63A to 63D.

In the sense amplifier module 13 according to the third embodiment in the configuration described above, the voltages of the nodes ND1 to ND5 are supplied to the sense amplifier units SAU in the segments SEG1 to SEG5, respectively, as the control signals BLC for the segments SEG1 to SEG5. The various control signals described above are generated, for example, by the sequencer 17.

[3-2] Operations

The waveforms of the various control signals for the read operation of the semiconductor memory device 10 according to the third embodiment are similar to the waveforms of the various control signals described in the first embodiment using FIG. 12. In other words, in the third embodiment, the sequencer 17 controls the control signal BLC as is the case with the segment SEG corresponding to the Near side of the word line WL according to the first embodiment.

In the read operation according to the third embodiment, the sequencer 17 changes the direction in which the control signal BLC is applied, and adjusts the amount of kick for each segment SEG based on the address of the selected word line WL. The plurality of word lines WL is hereinafter assumed to be classified into two groups. For example, the word lines WL are classified into a first group with a relatively large RC time constant and a second group with a relatively small RC time constant.

FIG. 20 illustrates an example of the control method for the kick operation according to the third embodiment. The sequencer 17 is hereinafter assumed to maintain the control signals S1 to S4 at the "H" level during the read operation and to control the control signals S1 to S4 as described below during the kick operation.

As illustrated in FIG. 20, if the selected block is an even-numbered block, the sequencer 17 brings the control signals SELL and SELR to the "H" level and the "L" level, respectively, to set the transistors 60 and 61 to the on state and the off state, respectively. Then, the control signal BLC1 is supplied to the modules in the sense amplifier module 13 via the transistor 60. If any of the word lines WL in the first group is selected, the sequencer 17, for example, brings the control signals S1, S2, S3, and S4 to the "H" level, the "H" level, the "L" level, and the "L" level, respectively, to set the transistors 63A and 63B to the on state, while setting the transistors 63C and 63D to the off state. Then, the control signal BLC1 supplied via the transistor 60 passes through the transistors 63A and 63B in the variable resistors 62A and 62B, respectively, and through the resistance elements 64C and 64D in the variable resistors 62C and 62D, respectively. On the other hand, if any of the word lines WL in the second group is selected, the sequencer 17, for example, brings the control signals S1, S2, S3, and S4 to the "H" level, the "L" level, the "L" level, and the "L" level, respectively, to set the transistor 63A to the on state, while setting the transistors 63B, 63C, and 63D to the off state. Then, the control signal BLC supplied via the transistor 60 passes through the transistor 63A in the variable resistor 62A and through the resistance elements 64B, 64C, and 64D in the variable resistors 62B, 62C, and 62D, respectively.

If the selected block is an odd-numbered block, the sequencer 17 brings the control signals SELL and SELR to the "L" level and the "H" level, respectively, to set the transistors 60 and 61 to the off state and the on state, respectively. Then, the control signal BLC2 is supplied to the modules in the sense amplifier module 13 via the transistor 61. If any of the word lines WL in the first group is selected, the sequencer 17, for example, brings the control signals S1, S2, S3, and S4 to the "L" level, the "L" level, the "H" level, and the "H" level, respectively, to set the transistors 63C and 63D to the on state, while setting the transistors 63A and 63B to the off state. Then, the control signal BLC2 supplied via the transistor 61 passes through the transistors 63D and 63C in the variable resistors 62D and 62C, respectively, and through the resistance elements 64B and 64A in the variable resistors 62B and 62A, respectively. On the other hand, if any of the word lines WL in the second group is selected, the sequencer 17, for example, brings the control signals S1, S2, S3, and S4 to the "L" level, the "L" level, the "L" level, and the "H" level, respectively, to set the transistor 63D to the on state, while setting the transistors 63A, 63B, and 63C to the off state. Then, the control signal BLC2 supplied via the transistor 61 passes through the transistor 63D in the variable resistor 62D and through the resistance elements 64C, 64B, and 64A in the variable resistors 62C, 62B, and 62A, respectively.

As described above, if the selected block is an even-numbered block, the control signal BLC1 is provided via the transistor 60 in a direction from the node ND1 toward the node ND5. If the selected block is an odd-numbered block, the control signal BLC2 is provided via the transistor 61 in a direction from the node ND5 toward the node ND1. Then, based on the address of the selected word line WL, the paths of the control signals BLC among the nodes ND1 to ND5 are changed.

Figure 21:
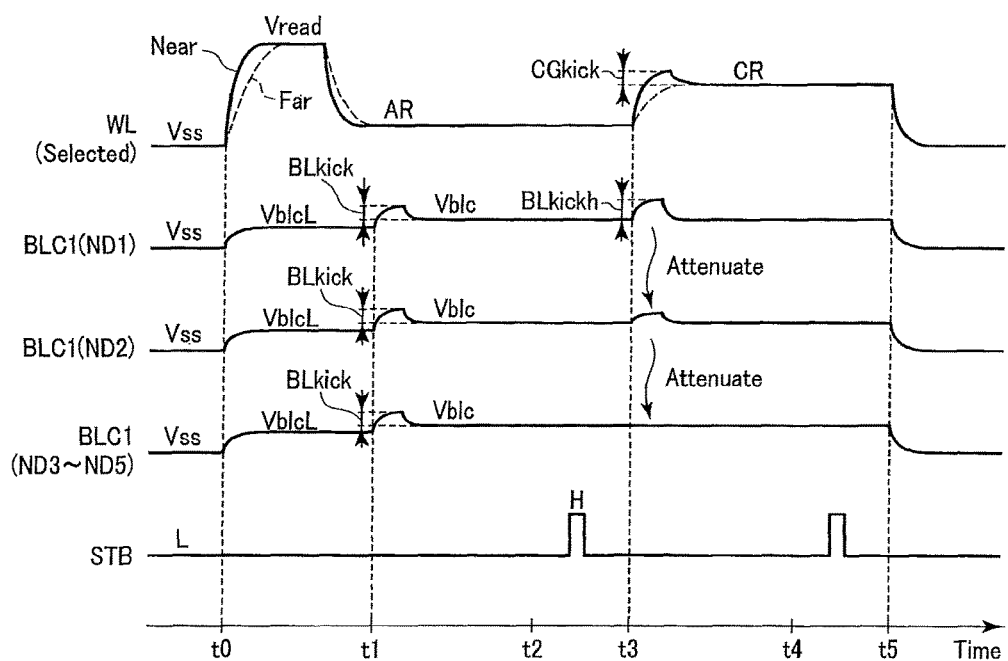
FIG. 21 is a diagram illustrating examples of waveforms in the read operation in the semiconductor memory device according to the third embodiment.

FIG. 21 illustrates examples of waveforms obtained when an even-numbered block and one of the word lines WL in the first group are selected in the read operation of the semiconductor memory device 10 according to the third embodiment. FIG. 21 illustrates the waveforms for the Near side and Far side of the word line WL, the waveforms of the control signal BLC1 at the nodes ND1 to ND5, and the waveform of the control signal STB.

As illustrated in FIG. 21, the waveforms for the Near side and Far side of the word line WL and the waveform of the control signal STB are similar to the corresponding waveforms described in the first embodiment using FIG. 12. The waveform of the control signal BLC1 at the node ND1 is similar to the waveform of the control signal BLC1 described in the first embodiment using FIG. 12. The waveform of the control signal BLC1 at the node ND2 attenuates because the signal is provided from the node ND1 via the transistor 63A, with the amount of kick decreasing at the time t3. The waveform of the control signal BLC1 at the node ND3 attenuates because the signal is provided from the node ND2 via the transistor 63B, with the amount of kick further decreasing at the time t3. For example, the effect of the kick operation becomes invisible. The waveforms of the control signal BLC1 at the nodes ND4 and ND5 are, for example, similar to the waveform of the control signal BLC1 at the node ND3 because the signal is provided via the transistors 63C and 63D, respectively. In this manner, the control signal BLC is supplied to the sense amplifier unit SAU in the corresponding segment SEG, with the amount of kick varied at the nodes ND. The other operations of the semiconductor memory device 10 according to the third embodiment are similar to the corresponding operations of the semiconductor memory device 10 according to the first embodiment, and will thus not be described below.

By way of example, the case has been described where the sequencer 17 maintains the control signals S1 to S4 at the "H" level during the read operation and controls the control signals S1 to S4 during the kick operation. However, the present invention is not limited to this. For example, the sequencer 17 may control the control signals S1 to S4 as illustrated in FIG. 20, in the read operations in general.

[3-3] Effects of the Third Embodiment

As described above, the semiconductor memory device 10 according to the third embodiment is divided into smaller sense amplifier segments SEG than the semiconductor memory device 10 according to the first embodiment, and varies the direction in which the control signal BLC is applied based on the address of the selected block BLK. Specifically, for example, the sequencer 17 sets the transistors 60 and 61 to the on state and the off state, respectively, to allow the control signals BLC to be provided in a direction similar to the direction of the word line WL if an even-numbered block is selected.

The sense amplifier module 13 according to the third embodiment includes the variable resistors 62A to 62D to adjust the amount of kick in the control signal BLC for each segment SEG based on characteristics of the selected word line WL. Specifically, the sequencer 17 sets the transistor 63 in the variable resistor 62 to the off state in the Near-side area, and sets the transistor 63 in the variable resistor 62 to the on state in the Far-side area. If the transistor 63 is in the off state, the control signal BLC passes through the resistance element 64 to attenuate and thus has a reduced amount of kick. If the transistor 63 is in the on state, the control signal BLC passes through the transistor 63 to have a variation in the voltage thereof suppressed.

Consequently, the semiconductor memory device 10 according to the third embodiment can adjust the amount of kick in the control signal BLC supplied to each segment SEG. Therefore, as is the case with the first and second embodiments, the semiconductor memory device 10 according to the third embodiment can reduce the stabilization time for the voltage of each bit line BL when the kick operation is performed on the word line WL, enabling an increase in the speed of the read operation.

By way of example, the case has been described where the memory cell array 11 is divided into the areas AR1 to AR5 and where the sense amplifier module 13 includes the four variable resistors 62. However, the present invention is not limited to this. For example, the number of the variable resistors 62 included in the sense amplifier module 13 is designed based on the number of the areas AR into which the memory cell array 11 is divided for control.

Furthermore, by way of example, the case where the BLC drivers DR1 and DR2 are used has been described. However, the present invention is not limited to this. For example, the semiconductor memory device 10 may vary the direction in which the control signal BLC is supplied to the sense amplifier module 13 by controlling the transistors 60 and 61 connected to the common BLC driver DR.

[4] Fourth Embodiment

In the semiconductor memory device 10 according to a fourth embodiment, a common interconnect in the sense amplifier module 13 is used to apply the control signal BLC, and the different control signals BLC are applied to an array of the sense amplifier groups SAG from the respective opposite ends thereof. The semiconductor memory device 10 according to the fourth embodiment will be described in conjunction with differences from the first to third embodiments.

[4-1] Configuration

Figure 22:
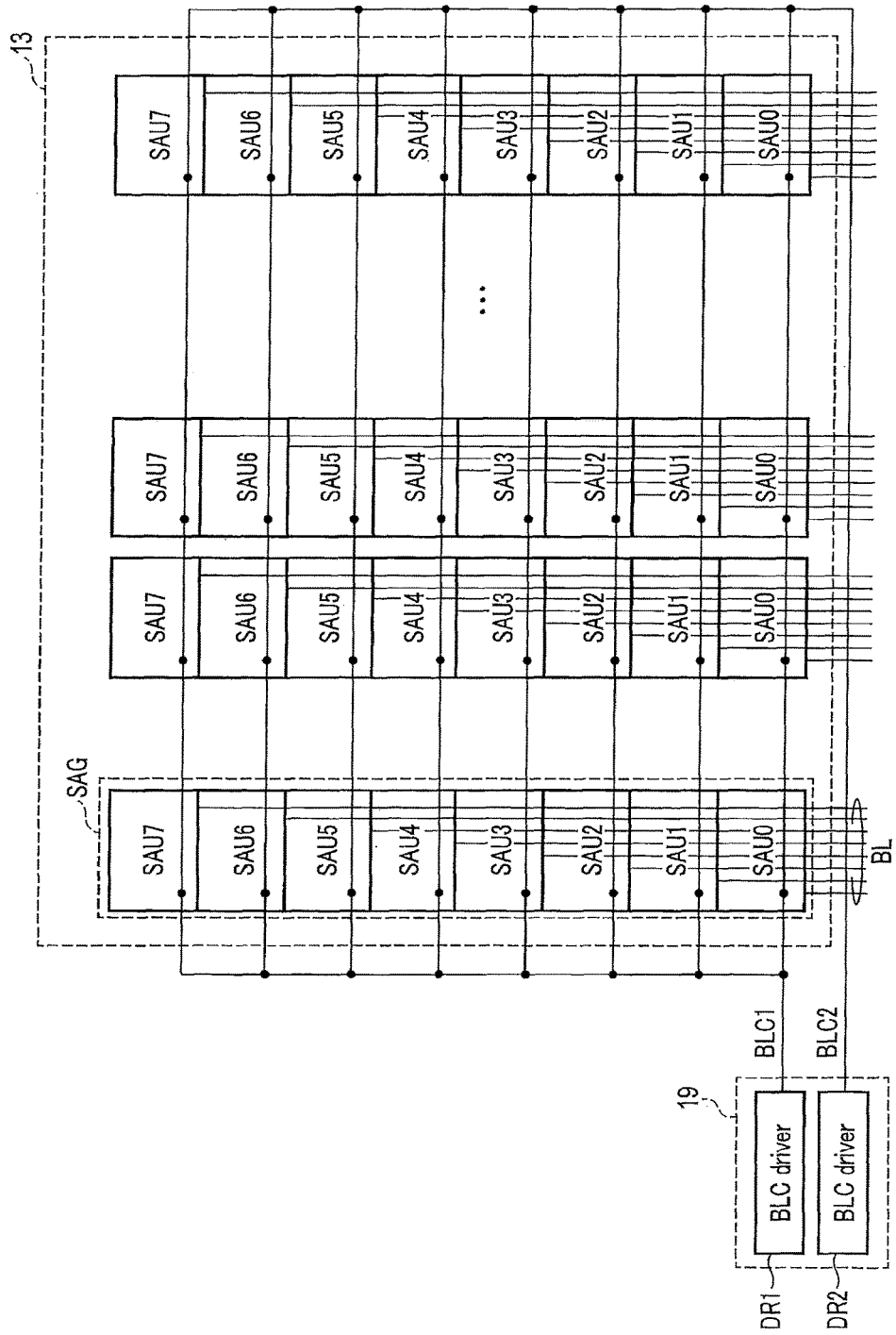
FIG. 22 is a block diagram illustrating a detailed configuration example of a sense amplifier module and a voltage generator included in a semiconductor memory device according to a fourth embodiment.

FIG. 22 is a block diagram illustrating a detailed configuration example of the sense amplifier module 13 and the voltage generator 19 included in the semiconductor memory device 10 according to the fourth embodiment. The configuration in FIG. 22 corresponds to the configuration described in the first embodiment using FIG. 5 and to which the BLC drivers DR1 and DR2 are connected commonly to the sense amplifier units SAU in the sense amplifier module 13.

Specifically, for example, for each of the sense amplifier units SAU0 to SAU7 of each sense amplifier group SAG, the sense amplifier units SAU in the sense amplifier groups SAG are commonly connected together, for example, by an interconnect extending in a direction intersecting the bit lines BL as illustrated in FIG. 22. Then, first ends of the interconnects connecting the sense amplifier units SAU together are connected commonly to the BLC driver DR1, and second ends of the interconnects are connected commonly to the BLC driver DR2. In other words, for the interconnects through which the control signal BLC is supplied to the sense amplifier units SAU in the sense amplifier module 13, the first end is connected to the BLC driver DR1, and the second end is connected to the BLC driver DR2. The BLC driver DR1 applies a voltage corresponding to the control signal BLC1 through a first end of the sense amplifier module 13. The BLC driver DR2 applies a voltage corresponding to the control signal BLC2 through a second end of the sense amplifier module 13.

Figure 23:
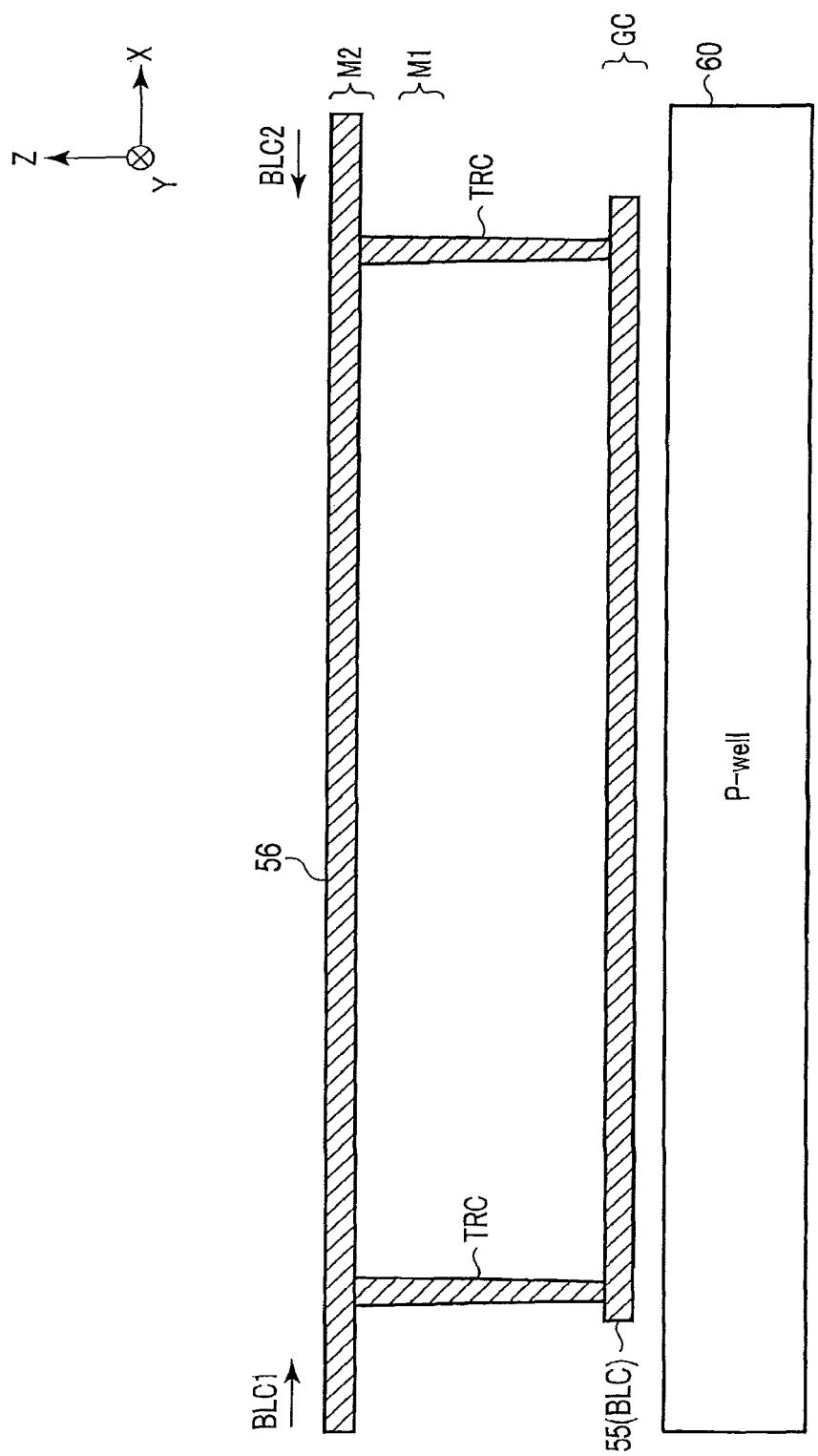
FIG. 23 is a diagram illustrating an example of a sectional structure of the sense amplifier module included in the semiconductor memory device according to the fourth embodiment.

FIG. 23 is a diagram illustrating an example of a sectional structure of the sense amplifier module 13 included in the semiconductor memory device 10 according to the fourth embodiment. The configuration in FIG. 23 corresponds to the configuration described in the first embodiment using FIG. 10 and in which the conductors 55 and 56 are integrated together.

Specifically, as illustrated in FIG. 23, the integral conductor 55 is formed in an interconnect layer GC, the integral conductor 56 is formed in an interconnect layer M2, and a plurality of via contacts TRC is provided between the conductors 55 and 56. In an area not illustrated in the drawings, a first end of the conductor 56 is connected to the BLC driver DR1, and a second end of the conductor 56 is connected to the BLC driver DR2. Voltages corresponding to the control signals BLC1 and BLC2 are applied to the conductor 56 through the first and second ends thereof, respectively, and applied to the conductor 55 via the via contacts TRC. The remaining part of the configuration of the semiconductor memory device 10 according to the fourth embodiment is similar to the corresponding part of the configuration of the semiconductor memory device 10 according to the first embodiment, and will thus not be described below.

[4-2] Operations

As is the case with the operations of the semiconductor memory device 10 described in the first embodiment using FIG. 11, the semiconductor memory device 10 according to the fourth embodiment controllably determine whether or not to perform the kick operation on the control signal BLC1 and the control signal BLC2 based on the selected block BLK. Specifically, for example, if the selected block is an even-numbered block, the kick operation is performed on the control signal BLC1 and not performed on the control signal BLC2. On the other hand, if the selected block is an odd-numbered block, the kick operation is performed on the control signal BLC2 and not performed on the control signal BLC1.

FIG. 24 illustrates examples of waveforms obtained when an even-numbered block and one of the word lines WL in the first group are selected in the read operation of the semiconductor memory device 10 according to the fourth embodiment. FIG. 24 illustrates the waveforms for the Near side and Far side of the word line WL, the waveforms of the control signals BLC1 and BLC2, and the waveform of the control signal STB.

As illustrated in FIG. 24, the waveforms for the Near side and Far side of the word line WL and the waveform of the control signal STB are similar to the corresponding waveforms described in the first embodiment using FIG. 12. The waveform of the control signal BLC1 is similar to the waveform of the control signal BLC1 described in the first embodiment using FIG. 12. The waveform of the control signal BLC2 is similar to the waveform of the control signal BLC2 described in the first embodiment using FIG. 12. In the semiconductor memory device 10 according to the fourth embodiment, when the kick operation is performed on the word line WL at the time t3, the BLC driver DR1 temporarily applies a voltage higher than the voltage Vblc by an amount equal to the voltage BLkickh, and the BLC driver DR2 maintains the voltage Vblc. The other operations of the semiconductor memory device 10 according to the third embodiment are similar to the corresponding operations of the semiconductor memory device 10 according to the first embodiment, and will thus not be described below.

[4-3] Effects of the Forth Embodiment

As described above, the semiconductor memory device 10 according to the fourth embodiment includes the BLC driver DR1 and DR2 which can apply voltages to the sense amplifier module 13 through the first and second ends, respectively, of the interconnects through which the control signal BLC is supplied. The BLC drivers DR1 and DR2 apply different voltages through the first and second ends of the interconnects when the kick operation is performed on the word line WL.

Specifically, the semiconductor memory device 10 according to the fourth embodiment executes control during the kick operation on the word line WL, for example, in such a manner that the BLC driver DR applying the control signal BLC from the Near side performs the kick operation, whereas the BLC driver DR applying the control signal BLC from the Far side does not perform the kick operation.

Consequently, as is the case with the first to third embodiments, the semiconductor memory device 10 according to the fourth embodiment can adjust the amount of kick in the control signal BLC in keeping with a variation in the amount of kick on the word line WL according to the distance from the row decoder module 12. Therefore, as is the case with the first to third embodiments, the semiconductor memory device 10 according to the fourth embodiment can reduce the stabilization time for the voltage of each bit line BL when the kick operation is performed, enabling an increase in the speed of the read operation.

[5] Fifth Embodiment

The semiconductor memory device 10 according to a fifth embodiment controls the control signal BLC for each set area when the row decoder modules 12A and 12B drive each block BLK from the respective opposite sides of the block. The semiconductor memory device 10 according to the fifth embodiment will be described in conjunction with differences from the first to fourth embodiments.

[5-1] Configuration

FIG. 25 is a block diagram illustrating a configuration example of the memory cell array 11 and the row decoder module 12 included in the semiconductor memory device 10 according to the fifth embodiment. The configuration in FIG. 25 is different from the configuration described in the second embodiment using FIG. 15 in the configuration of the row decoder modules 12A and 12B.

Specifically, the row decoder module 12A according to the fifth embodiment includes the row decoder RDA corresponding to the blocks BLK0 to BLKn, and the row decoder module 12B according to the fifth embodiment includes the row decoder RDB corresponding to the blocks BLK0 to BLKn. In other words, the blocks BLK according to the fifth embodiment are driven from the opposite sides thereof by the row decoder modules 12A and 12B. Specifically, the row decoder RDA supplies a voltage to the block BLK through a first end of the conductor 42 corresponding to the word line WL, and the row decoder RDB supplies a voltage to the block BLK through a second end of the conductor 42. Areas of each block BLK located near the row decoders RDA and RDB are hereinafter referred to as "Edges". An area of each block BLK which includes a central portion thereof is hereinafter referred to as a "Center". In other words, the areas AR1 and AR2 correspond to the Edge portions, and the area AR3 corresponds to the Center portion.

Figure 26:
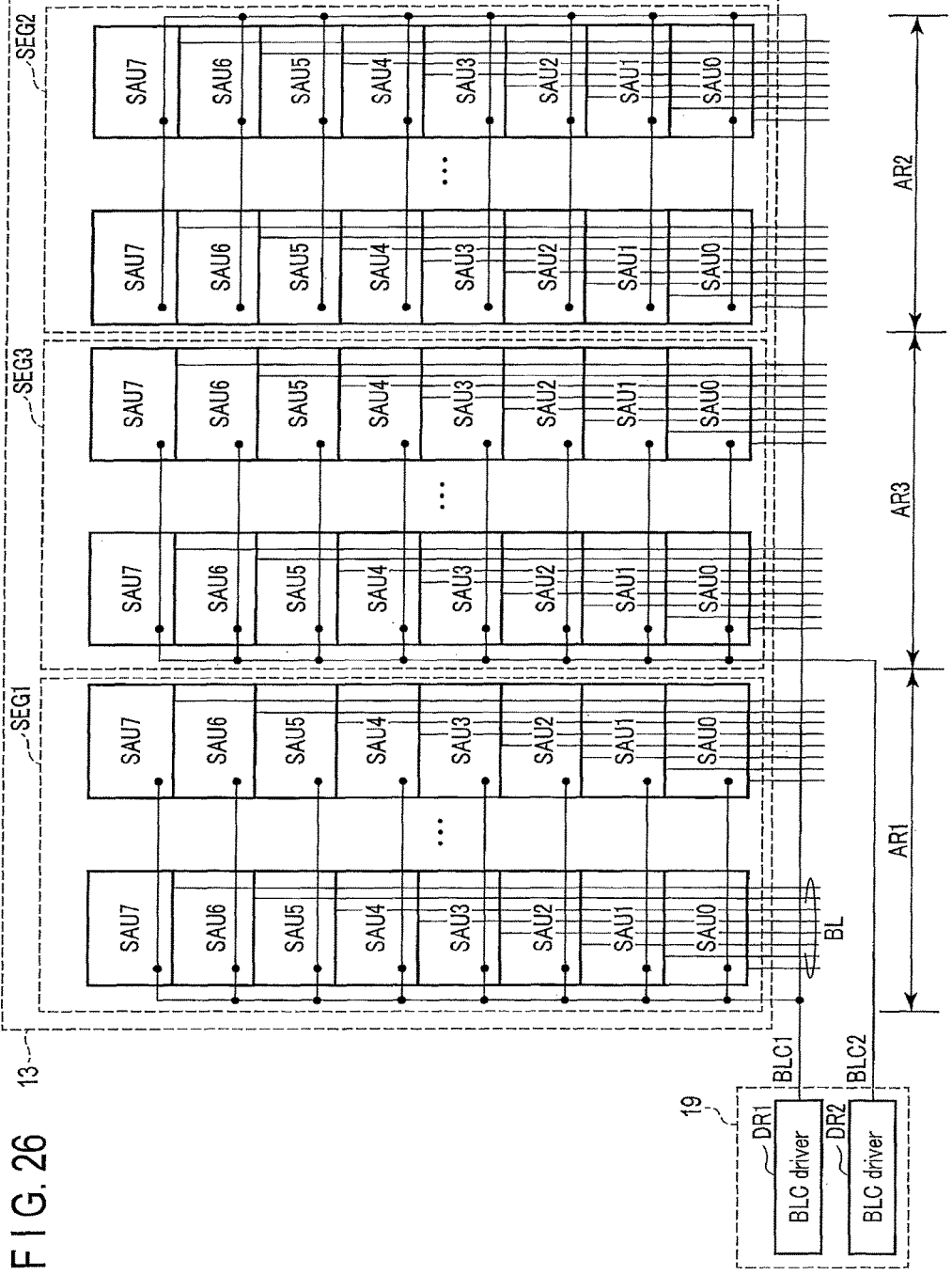
FIG. 26 is a block diagram illustrating a detailed configuration example of a sense amplifier module and a voltage generator included in a semiconductor memory device according to a fifth embodiment.

FIG. 26 is a block diagram illustrating a detailed configuration example of the sense amplifier module 13 and the voltage generator 19 included in the semiconductor memory device 10 according to the fifth embodiment. The configuration in FIG. 26 is different from the configuration described in the second embodiment using FIG. 15 in that the BLC driver DR3 is omitted and that the BLC drivers DR1 and DR2 have a different connection relationship with each sense amplifier segment SEG.

Specifically, as illustrated in FIG. 26, in the fifth embodiment, the BLC driver DR1 supplies the generated control signal BLC1 to the sense amplifier units SAU included in the segments SEG1 and SEG2, and the BLC driver DR2 supplies the generated control signal BLC2 to the sense amplifier units SAU included in the segments SEG3. The remaining part of the configuration of the semiconductor memory device 10 according to the fifth embodiment is similar to the corresponding part of the configuration of the semiconductor memory device 10 according to the first embodiment, and will thus not be described below.

[5-2] Operations

The semiconductor memory device 10 according to the fifth embodiment, for example, performs the kick operation on the control signal BLC1 and does not perform the kick operation on the control signal BLC2 when the kick operation is performed on the word line WL in the read operation.

FIG. 27 illustrates examples of waveforms obtained in the read operation of the semiconductor memory device 10 according to the fifth embodiment. FIG. 27 illustrates the waveforms for portions of the word line WL in the Center and Edge portions, the waveforms of the control signals BLC1 and BLC2, and the waveform of the control signal STB.

As illustrated in FIG. 27, the waveform for the portion of the word line WL in the Center portion and the waveform of the control signal BLC1 are similar to the waveform for the Near side of the word line WL and the waveform of the control signal BLC1 described in the first embodiment using FIG. 12, and the waveform for the portion of the word line WL in the Edge portion and the waveform of the control signal BLC2 are similar to the waveform for the Far side of the word line WL and the waveform of the control signal BLC2 described in the first embodiment using FIG. 12. In other words, the sequencer 17 controls the control signal BLC for the sense amplifier segments SEG1 and SEG2 corresponding to the Edge portion as is the case with the Near side described in the first embodiment, and controls the control signal BLC for the sense amplifier segment SEG3 as is the case with the Far side described in the first embodiment. The other operations of the semiconductor memory device 10 according to the fifth embodiment are similar to the corresponding operations of the semiconductor memory device 10 according to the first embodiment, and will thus not be described below.

[5-3] Effects of the Fifth Embodiment

As described above, the semiconductor memory device 10 according to the fifth embodiment is configured in such a manner that the word line WL is driven from the opposite sides thereof by the row decoder modules 12A and 12B. When the word line WL is driven from the opposite sides thereof, for example, the waveforms for the portions of the word line WL in the two Edge portions illustrated in FIG. 25 are similar to the waveform for the Near side of the word line WL described in the first embodiment, and the waveform for the portion of the word line WL in the Center portion illustrated in FIG. 25 is similar to the waveform for the Far side of the word line WL described in the first embodiment.

Thus, to perform the kick operation on the word line WL, the semiconductor memory device 10 according to the fifth embodiment controls the control signal BLC corresponding to the Edge portion as is the case with the Near side described in the first embodiment, and controls the control signal BLC corresponding to the Center portion as is the case with the Far side described in the first embodiment.

Consequently, the semiconductor memory device 10 of the fifth embodiment can optimize the amount of kick in the control signal BLC in the Edge portion and in the Center portion, enabling a reduction in the stabilization time for the voltage of each bit lines BL0. Therefore, as is the case with the first embodiment, the semiconductor memory device 10 according to the fifth embodiment can increase the speed of the read operation.

By way of example, the case has been described where, when the kick operation is performed on the word line WL, the kick operation is not performed on the control signal BLC2 for the Center portion. However, the present invention is not limited to this. For example, the sequencer 17 may also perform the kick operation on the control signal BLC2, and the amount of kick in the control signal BLC2 corresponding to the Center portion may be smaller than the amount of kick in the control signal BLC1 corresponding to the Edge portion. Even in such a case, the semiconductor memory device 10 according to the fifth embodiment can produce the above-described effects.

[6] Sixth Embodiment

The semiconductor memory device 10 according to a sixth embodiment relates to a configuration example of the sense amplifier module 13 which varies the amount of kick according to the first to fifth embodiments. The semiconductor memory device 10 according to the sixth embodiment will be described in conjunction with differences from the first to fifth embodiments.

[6-1] Configuration

FIG. 28 illustrates a configuration example of the sense amplifier module 13 included in the semiconductor memory device according to the sixth embodiment, and illustrates an example of a circuit configuration of one sense amplifier unit SAU. As illustrated in FIG. 28, the configuration of the sense amplifier unit SAU according to the sixth embodiment is different, in the configuration of the sense amplifier portion SA, from the configuration of the sense amplifier unit SAU described in the first embodiment using FIG. 6.

Specifically, the sense amplifier module 13 according to the sixth embodiment includes transistors 22A and 22B. The transistors 22A and 22B are connected in parallel between the node COM and the corresponding bit line BL. A control signal BLCa is input to a gate of the transistor 22A, and a control signal BLCb is input to a gate of the transistor 22B. In other words, the sense amplifier portion SA includes the plurality of transistors connected in parallel and which can be independently controlled by the sequencer 17.

Among the plurality of transistors 22 connected in parallel, for example, any one transistor corresponds to a transistor used for normal operations, and the other transistors correspond to transistors used only during the kick operation. However, the present invention is not limited to this, and the plurality of transistors connected in parallel may be used for normal operations.

[6-2] Operations

For the sense amplifier unit SAU according to the sixth embodiment, the sequencer 17 controls the transistors 22A and 22B to vary the amount of kick. FIG. 29 illustrates an example of a control method for the transistors 22A and 22B according to the sixth embodiment.

As illustrated in FIG. 29, to increase the amount of kick, the sequencer 17, for example, brings both the control signals BLCa and BCLb to the "H" level to set the transistors 22A and 22B to the on state. Then, the amount of current flowing between the node COM and the corresponding bit line BL decreases to reduce a charging speed for the bit line BL. The other operations of the semiconductor memory device 10 according to the sixth embodiment are similar to the corresponding operations of the semiconductor memory device 10 according to the first embodiment, and will thus not be described below.

[6-3] Effects of the Sixth Embodiment

As described above, the sense amplifier module 13 according to the sixth embodiment can adjust the amount of kick in the control signal BLC in a detailed manner during the kick operation on the word line WL.

For example, the optimal amount of kick in the control signal BLC may vary according to the position of the selected memory cell transistor MT. Thus, the semiconductor memory device 10 according to the sixth embodiment varies the amount of kick in the control signal BLC by varying the control of the transistors 22A and 22B in the sense amplifier unit SAU based on the address of the selected memory cell transistor MT.

Consequently, the semiconductor memory device 10 according to the sixth embodiment can apply the optimal amount of kick to the control signal BLC during various operations.

[7] Modifications and the Like

The semiconductor memory device 10 according to the embodiments includes the first and second memory cells <MT, FIG. 2>, the first word line <WL, FIG. 2>, the first and second sense amplifiers <SAU, FIG. 5>, the first and second bit lines <BL, FIG. 2>, and the controller <17, FIG. 1>. The first word line WL is connected to the first and second memory cells. The first and second sense amplifiers include the first and second transistors <22, FIG. 6>, respectively. The first bit line is connected between the first memory cell and the first transistor. The controller performs the read operation. In the read operation, the controller applies the kick voltage <CR+CGkick, FIG. 12> higher than the read voltage to the first word line before applying the read voltage to the first word line, and applies a first voltage <Vblc+ BLkick, FIG. 12> to the gate of the first transistor and a second voltage <Vblc, FIG. 12> lower than the first voltage to the gate of the second transistor, while applying the kick voltage to the first word line. Consequently, a semiconductor memory device which can operate fast can be provided.

In the above-described embodiments, the case where the lower read voltage is first applied in the read operation has been described by way of example. However, the present invention is not limited to this. For example, as illustrated in FIG. 30, the higher read voltage may first be applied, and a threshold voltage for the memory cell transistor MT may be determined. FIG. 30 illustrates examples of waveforms obtained in the read operation of the semiconductor memory device 10 according to a modification of the first embodiment. FIG. 30 illustrates the waveforms for the selected word line WL, the control signal BLC1 corresponding to the Near side, the control signal BLC2 corresponding to the Far side, and the control signal STB.

As illustrated in FIG. 30, the row decoder module 12 applies the read voltage CR to the selected word line WL at the time t0, and applies the read voltage AR to the selected word line WL at the time t1. With the kick operation being performed, before the read voltage CR is provided, a voltage higher than the read voltage CR by an amount equal to the voltage CGkick is temporarily applied to the Near side of the word line WL. On the other hand, on the Far side of the word line WL, the read voltage CR is directly reached due to the effect of an RC time constant. The control signal BLC1 corresponding to the Near side performs the kick operation when the read voltage CR is applied to the word line WL. The control signal BLC2 corresponding to the Far side does not perform the kick operation when the read voltage CR is applied to the word line WL. When each read voltage is applied and the control signal STB is then asserted, the sense amplifier unit SAU determines the threshold voltage for the memory cell transistor MT. At the time t3, the read operation ends. In this manner, the above-described embodiments are applicable to any cases where the kick operation is performed on the word line WL.

In the above-described embodiments, the case where the execution of the read operation is intended for all the bit lines BL has been described by way of example. However, the present invention is not limited to this. For example, the semiconductor memory device 10 may be configured in such a manner that the read operation may be divisively performed for the odd-numbered bit lines and for the even-numbered bit lines. In this case, two sense amplifier modules 13 are provided, for example, in association with a set of the odd-numbered bit lines and a set of the even-numbered bit lines, respectively. The sense amplifier modules 13 corresponding to the set of odd-numbered bit lines and the set of even-numbered bit lines, respectively, are provided, for example, with different control signals BLC. The above-described embodiments are also applicable to the semiconductor memory device 10 configured as described above.

By way of example, the read operation for upper page data has been described in the embodiments. However, the present invention is not limited to this. For example, the operations described in the embodiments are also applicable to a read operation for lower page data. Furthermore, by way of example, the case where data of 2 bits is stored in one memory cell has been described in the embodiments. However, the present invention is not limited to this. For example, data of 1 bit or 3 or more bits may be stored in one memory cell. Even in such a case, the read operation described in the first to sixth embodiments can be performed.

In the above-described embodiments, the case has been described where the voltage applied to the word line. WL in the kick operation and the amount of kick in the voltage corresponding to the control signal BLC are approximately constant, by way of example. However, the present invention is not limited to this. For example, the voltages may be varied based on the address of the selected word line WL. Specifically, when the memory cells include a three-dimensionally stacked structure, for example, the RC time constant may vary between a set of the word lines WL in the upper layer and a set of the word lines WL in the lower layer, leading to the appropriate amount of kick varying between the sets. In such a case, the semiconductor memory device 10 can increase the speed of the read operation by applying optimized amounts of kick to the different sets of the word lines WL in the respective layers.

By way of example, the case where the row decoder module 12 is provided below the memory cell array 11 has been described in the embodiments. However, the present invention is not limited to this. For example, the memory cell array 11 may be formed on the semiconductor substrate, and the row decoder modules 12A and 12B may be arranged opposite to respective ends of memory cell array 11. Even in such a case, the operations described in the embodiments can be performed.

By way of example, the case where the semiconductor memory device 10 reads data on a page by page basis has been described in the embodiments. However, the present invention is not limited to this. For example, the semiconductor memory device 10 may read data of a plurality of bits stored in the memory cells at the same time. Even in such a case, the kick operation may be applied when the read operation is performed, and thus, the semiconductor memory device 10 can apply the operations described in the embodiments.

In the above-described embodiments, the read operation has been described using the timing charts illustrating the waveform for the word line WL. The waveform for the word line WL is, for example, similar to the waveform for a signal line through which voltages are supplied to the row decoder module 12. In other words, the voltage applied to the word line WL and the period when the voltage is applied to the word line WL according to the above-described embodiments can be roughly known by checking the voltage of the corresponding signal line. The voltage of the word line WL may be lower than the voltage of the corresponding signal line due to a voltage drop caused by a transfer transistor included in the row decoder module 12.

By way of example, the case where MONOS films are used for the memory cells has been described in the embodiments. However, the present invention is not limited to this. For example, even when memory cells comprising floating gates are used, similar effects can be produced by performing the read operation and the write operation described in the embodiments.

In the above-described embodiments, the case has been described where the via contact VC to which each conductor 42 is electrically connected extends through the conductors 42, by way of example. However, the present invention is not limited to this. For example, the via contact VC corresponding to each conductor 42 may extend from a conductor 42 in a different interconnect layer through the conductor 40 and may be connected to the corresponding diffusion area 52. By way of example, the case has been described where the via contacts BC, VC, HU, and TRC are each formed of a pillar in a single stage. However, the present invention is not limited to this. For example, each of these via contacts may be formed by coupling two or more pieces of a pillar together in stages. The two or more pieces of the pillar may be coupled together in stages via different conductors.

In the above-described embodiments, the memory cell array 11 may include a different configuration. Another configuration of the memory cell array 11 is described, for example, in U.S. patent application Ser. No. 14/407,403 entitled "Three-dimensionally Stacked Non-volatile Semiconductor Memory" filed on Mar. 19 2009. Other configurations are described in U.S. patent application Ser. No. 14/406,524 entitled "Three-dimensionally Stacked Non-volatile Semiconductor Memory" filed on Mar. 18 2009, U.S. patent application Ser. No. 12/679,991 entitled "Non-volatile Semiconductor Memory Device and Manufacturing Method therefor" filed on Mar. 25 2010, and U.S. patent application Ser. No. 12/532,030 entitled "Semiconductor Memory and Manufacturing Method therefor" filed on Mar. 23 2009. These patent applications are incorporated by reference herein in their entirety.

The block BLK is, for example, an erase unit of data in the three-dimensional semiconductor memory device, but is not limited thereto. Other erase operations are described in U.S. patent application Ser. No. 13/235,389 entitled "Nonvolatile semiconductor memory device" filed on Sep. 18, 2011, and in U.S. patent application Ser. No. 12/694,690 entitled "Non-volatile semiconductor memory device" filed on Jan. 27, 2010. These patent applications are incorporated by reference herein in their entirety.

The "connection" as used herein refers to electric connection and does not exclude interposition of another element between connected elements. The "cutoff" as used herein refers to the off state of a switch of interest and does not exclude flow of a microcurrent, for example, a leakage current from a transistor.

The "read operation" as used herein is not limited to the operation of reading data stored in the memory cell array 11 based on an indication from an external memory controller (hereinafter referred to as a normal read operation). For example, the "read operation" described in the embodiments can be applied to a verify operation in the write operation and a verify operation in an erase operation. The verify operation in the write operation is a read operation of checking whether the threshold voltage of the memory cell transistor MT is at or higher than the desired threshold voltage as a result of progress of the write operation. The verify operation in the erase operation is a read operation of checking whether the threshold voltage of the memory cell transistor MT has transitioned to an erase state (an "ER level") as a result of the erase operation.

Specifically, the semiconductor memory device 10 can perform, even in the verify operation, operations similar to those in the above-described embodiments by replacing the read voltage described in the embodiments with a verify voltage set for each verify operation. Such a verify operation may involve a different read operation and a different amount of voltage transitioned on the word line WL. Thus, in the verify operation, the amount of kick in the control signal BLC applied to the Near side and the amount of kick in the control signal BLC applied to the Far side may be set to values different from those used for the normal operation.

In the embodiments according to the present invention:

(1) The voltage applied to the word line selected for the read operation at the "A"-level may be, for example, 0 V to 0.55 V. The voltage is not limited thereto, and may be 0.1 V to 0.24 V, 0.21 V to 0.31 V, 0.31 V to 0.4 V, 0.4 V to 0.5 V, or 0.5 V to 0.55 V.

The voltage applied to the word line selected for the read operation at the "B"-level is, for example, 1.5 V to 2.3 V. The voltage is not limited thereto, and may be 1.65 V to 1.8 V, 1.8 V to 1.95 V, 1.95 V to 2.1 V, or 2.1 V to 2.3 V.

The voltage applied to the word line selected for the read operation at the "C"-level is, for example, 3.0 V to 4.0 V. The voltage is not limited thereto, and may be 3.0 V to 3.2 V, 3.2 V to 3.4 V, 3.4 V to 3.5 V, 3.5 V to 3.6 V, or 3.6 V to 4.0 V.

The time (tR) for the read operation may be, for example, 25 μs to 38 μs, 38 μs to 70 μs, or 70 μs to 80 μs.

(2) The write operation includes the program operation and the verification operation as described above. In the write operation, the voltage first applied to the word line selected for the program operation may be, for example, 13.7 V to 14.3 V. The voltage is not limited thereto, and may be 13.7 V to 14.0 V or 14.0 V to 14.6 V.

The voltage first applied to the selected word line in the writing into an odd word line, and the voltage first applied to the selected word line in the writing into an even word line may be changed.

When the program operation is an incremental step pulse program (ISPP) type, a step-up voltage is, for example, about 0.5.

The voltage applied to the unselected word line may be, for example, 6.0 V to 7.3 V. The voltage is not limited thereto, and may be, for example, 7.3 V to 8.4 V or may be 6.0 V or less.

The pass voltage to be applied may be changed depending on whether the unselected word line is an odd word line or an even word line.

The time (tProg) for the write operation may be, for example, 1700 μs to 1800 μs, 1800 μs to 1900 μs, or 1900 μs to 2000 μs.

(3) In the erase operation, the voltage first applied to a well which is formed on the semiconductor substrate and over which the memory cells are arranged may be, for example, 12 V to 13.6 V. The voltage is not limited thereto, and may be, for example, 13.6 V to 14.8 V, 14.8 V to 19.0 V, 19.0 to 19.8 V, 19.8 V to 21 V.

The time (tErase) for the erase operation may be, for example, 3000 μs to 4000 μs, 4000 μs to 5000 μs, or 4000 μs to 9000 μs.

(4) The structure of the memory cell may have the charge storage layer disposed on the semiconductor substrate (silicon substrate) via a tunnel insulating film having a thickness of 4 to 10 nm. This charge storage layer may have a stacked structure including an insulating film of SiN or SiON having a thickness of 2 to 3 nm and polysilicon having a thickness of 3 to 8 nm. A metal such as Ru may be added to polysilicon. An insulating film is provided on the charge storage layer. This insulating film has, for example, a silicon oxide film having a thickness of 4 to 10 nm intervening between a lower high-k film having a thickness of 3 to 10 nm and an upper high-k film having a thickness of 3 to 10 nm. The high-k film includes, for example, HfO. The silicon oxide film can be greater in thickness than the high-k film. A control electrode having a thickness of 30 to 70 nm is formed on the insulating film via a material for work function adjustment having a thickness of 3 to 10 nm. Here, the material for work function adjustment includes a metal oxide film such as TaO or a metal nitride film such as TaN. W, for example, can be used for the control electrode.

An air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first memory cell and a second memory cell;
   a first word line connected to each of the first and second memory cells;
   a first sense amplifier and a second sense amplifier including a first transistor and a second transistor, respectively;
   a first bit line connected between the first memory cell and the first transistor;
   a second bit line connected between the second memory cell and the second transistor; and
   a controller configured to perform a read operation, wherein
   the controller is further configured:
   to apply, in the read operation, a kick voltage higher than a read voltage to the first word line before applying the read voltage to the first word line, and
   to apply, in the read operation, a first voltage to a gate of the first transistor and a second voltage lower than the first voltage to a gate of the second transistor while applying the kick voltage to the first word line.

2. The device of claim 1, wherein
   the controller is further configured to apply, in the read operation, the second voltage to each of the gate of the first transistor and the gate of the second transistor while applying the read voltage to the first word line.

3. The device of claim 1, further comprising:
   a first conductor provided to extend in a first direction and to function as the first word line;
   a first pillar and a second pillar provided to extend through the first conductor, an intersection between the first pillar and the first conductor functioning as the first memory cell and an intersection between the second pillar and the first conductor functioning as the second memory cell; and
   a third pillar provided on the first conductor and electrically connected to the first conductor.

4. The device of claim 3, wherein
   a spacing between the third pillar and the first pillar in the first direction is shorter than a spacing between the third pillar and the second pillar in the first direction.

5. The device of claim 3, wherein
   the controller is further configured to apply a voltage to the first word line via the third pillar, and the voltage is applied to the first word line from one side in the first direction.

6. The device of claim 4, further comprising:
   a third memory cell and a fourth memory cell connected to the first and second bit lines, respectively, and included in a block different from a block including the first and second memory cells; and
   a second word line connected to the third and fourth memory cells, wherein
   the controller is further configured:
   to apply, in the read operation, the kick voltage before applying the read voltage to the second word line, and
   to apply, in the read operation, the second voltage to the gate of the first transistor and the first voltage to the gate of the second transistor, while applying the kick voltage to the second word line.

7. The device of claim 6, wherein
   the controller is further configured to apply, in the read operation, the second voltage to each of the gate of the first transistor and the gate of the second transistor while applying the read voltage to the second word line.

8. The device of claim 6,
   wherein the third pillar and a fourth pillar provided to extend through the second conductor, an intersection between the third pillar and the second conductor functioning as the third memory cell and an intersection between the fourth pillar and the second conductor functioning as the fourth memory cell;
   a third conductor provided to extend in a second direction intersecting the first direction and electrically connected to the first and third pillars;
   a fourth conductor provided to extend in the second direction and electrically connected to the second and fourth pillars;
   a fifth pillar provided on the first conductor and electrically connected to the first conductor; and a sixth pillar provided on the second conductor and electrically connected to the second conductor.

9. The device of claim 8, wherein
a spacing between the fifth pillar and the first pillar in the first direction is shorter than a spacing between the fifth pillar and the second pillar in the first direction, and
a spacing between the sixth pillar and the fourth pillar in the first direction is shorter than a spacing between the sixth pillar and the third pillar in the first direction.

10. The device of claim 8, wherein
the controller is further configured to apply a voltage to the first word line via the fifth pillar and to apply a voltage to the second word line via the sixth pillar, and
the voltage is applied to each of the first and second word lines from one side in the first direction.

11. The device of claim 8, further comprising:
a third bit line;
a fifth memory cell and a sixth memory cell each connected to the third bit line and connected to the first and second word lines, respectively; and
a third sense amplifier including a third transistor connected to the third bit line, wherein
the controller is configured:
to apply, in the read operation, the second voltage to a gate of the third transistor while applying the kick voltage to the first word line, and
to apply, in the read operation, the second voltage to the gate of the third transistor while applying the kick voltage to the second word line.

12. The device of claim 11, further comprising:
a seventh pillar provided to extend through the first conductor, an intersection between the seventh pillar and the first conductor functioning as the fifth memory cell;
an eighth pillar provided to extend through the second conductor, an intersection between the eighth pillar and the second conductor functioning as the sixth memory cell; and
a fifth conductor configured to extend in the second direction and provided between the third conductor and the fourth conductor and electrically connected to the second and fourth pillars.

13. The device of claim 12, wherein
a spacing between the fifth pillar and the seventh pillar in the first direction is longer than the spacing between the fifth pillar and the first pillar in the first direction and shorter than the spacing between the fifth pillar and the second pillar in the first direction, and
a spacing between the sixth pillar and the eighth pillar in the first direction is longer than the spacing between the sixth pillar and the fourth pillar in the first direction and shorter than the spacing between the sixth pillar and the third pillar in the first direction.

14. The device of claim 11, including
a conductor configured to function as a gate electrode of the first and second transistors and to extend in the first direction;
a first driver connected to a first end side of the conductor in the first direction; and
a second driver connected to a second end side of the conductor in the first direction; wherein
the controller is further configured to allow, in the read operation, the first voltage and the second voltage to be applied to the conductor by the first driver and the second driver, respectively, while applying the kick voltage to the first word line.

15. The device of claim 14, wherein
the controller is further configured to allow, in the read operation, the second voltage and the first voltage to be applied to the conductor by the first driver and the second driver, respectively, while applying the kick voltage to the second word line.

16. The device of claim 1, further comprising:
a third memory cell connected to the first word line;
a third sense amplifier including a third transistor;
a third bit line configured to connect the third memory cell and the third transistor together;
a first conductor provided to extend in a first direction and to function as the first word line, a voltage being applied to the first conductor from opposite sides thereof in the first direction; and
a first pillar, a second pillar, and a third pillar provided to extend through the first conductor, intersections between the first conductor and each of the first, second, and third pillars functioning as the first, second, and third memory cells, respectively, the first, second, and third pillars being arrayed in the first direction, wherein
the controller is further configured to apply, in the read operation, the first voltage to a gate of the third transistor while applying the kick voltage to the first word line.

17. The device of claim 1, further comprising:
a third memory cell connected between the first bit line and the first memory cell;
a second word line connected to the third memory cell; and
a third transistor connected in parallel with the first transistor, wherein
the controller is further configured:
to apply, in the read operation, a kick voltage higher than a read voltage to the second word line before applying the read voltage to the second word line,
to apply, in the read operation, a third voltage to a gate of the third transistor while applying the kick voltage to the first word line, and
to apply, in the read operation, the first voltage to the gate of the first transistor and a fourth voltage different from the third voltage to the gate of the third transistor while applying the kick voltage to the second word line.

18. The device of claim 1, wherein
the first sense amplifier includes a third transistor connected to the first transistor,
the second sense amplifier includes a fourth transistor connected to the second transistor, and
the controller is further configured:
to apply, in the read operation, a third voltage to gates of the third and fourth transistors while applying the kick voltage to the first word line, and
to apply, in the read operation, a fourth voltage lower than the third voltage to the gates of the third and fourth transistors while applying the read voltage.

19. A semiconductor memory device comprising:
a plurality of memory cells each provided in one of a first area and a second area arrayed along a first direction;
a word line configured to extend in the first direction and connected to the plurality of memory cells, a voltage being applied to the word line from one side in the first direction;
a first bit line connected to the memory cell provided in the first area;
a second bit line connected to the memory cell provided in the second area;

a first sense amplifier and a second sense amplifier connected to the first and second bit lines, respectively; and a controller configured to perform a read operation, wherein the controller is further configured to apply, in the read operation, a kick voltage higher than a read voltage to the word line before applying the read voltage to the word line, and an amount of current supplied to the first bit line by the first sense amplifier is larger than an amount of current supplied to the second bit line by the second sense amplifier while the kick voltage is being applied to the word line.

20. A semiconductor memory device comprising:

a plurality of memory cells each provided in one of a first area, a second area, and a third area arrayed along a first direction;

a word line configured to extend in the first direction and connected to the plurality of memory cells, a voltage being applied to the word line from opposite sides in the first direction;

a first bit line connected to the memory cell provided in the first area;

a second bit line connected to the memory cell provided in the second area;

a third bit line connected to the memory cell provided in the third area;

a first sense amplifier, a second sense amplifier, and a third sense amplifier connected to the first, second, and third bit lines, respectively; and a controller configured to perform a read operation, wherein the controller is further configured to apply, in the read operation, a kick voltage higher than a read voltage to the word line before applying the read voltage to the word line, and an amount of current supplied to the first bit line by the first sense amplifier and an amount of current supplied to the third bit line by the third sense amplifier are each larger than an amount of current supplied to the second bit line by the second sense amplifier while the kick voltage is being applied to the word line.

* * * * *